US011984161B2

(12) United States Patent
Venkatesan et al.

(10) Patent No.: US 11,984,161 B2
(45) Date of Patent: *May 14, 2024

(54) CHARGE SCREENING STRUCTURE FOR SPIKE CURRENT SUPPRESSION IN A MEMORY ARRAY

(71) Applicant: Micron Technology, Inc., Boise, ID (US)

(72) Inventors: Srivatsan Venkatesan, Sandy, UT (US); Sundaravadivel Rajarajan, South Jordan, UT (US); Iniyan Soundappa Elango, Lehi, UT (US); Robert Douglas Cassel, Lehi, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,826

(22) Filed: May 25, 2022

(65) Prior Publication Data
US 2022/0319594 A1 Oct. 6, 2022

Related U.S. Application Data

(63) Continuation of application No. 17/222,874, filed on Apr. 5, 2021, now Pat. No. 11,348,640.

(51) Int. Cl.
*G11C 13/00* (2006.01)
*H10B 63/00* (2023.01)
(Continued)

(52) U.S. Cl.
CPC ...... *G11C 13/0059* (2013.01); *G11C 13/0004* (2013.01); *G11C 13/003* (2013.01);
(Continued)

(58) Field of Classification Search
CPC ............ G11C 13/0059; G11C 13/0004; G11C 13/003; G11C 2213/72; H01L 27/2427;
(Continued)

(56) References Cited

U.S. PATENT DOCUMENTS 5,180,683 A * 1/1993 Wakamiya ........ H01L 27/10817
438/254
5,486,717 A * 1/1996 Kokubo .............. H01L 27/1108
257/E27.101
(Continued)

FOREIGN PATENT DOCUMENTS

| CN | 108666417 A | * | 10/2018 | ........... G11C 11/161 |
| JP | 2020198387 A | * | 12/2020 | ......... H01L 23/5226 |
| WO | WO-2022123284 A1 | * | 6/2022 | ......... G11C 16/0433 |

OTHER PUBLICATIONS

Chen, Wenbo, Understanding of Oxide Based Resistive Random Access Memory Devices with Multilevel Resistance, 2017, The University of Toledo. All pages. (Year: 2017).*

(Continued)

Primary Examiner — Michael T Tran
(74) Attorney, Agent, or Firm — Greenberg Traurig

(57) ABSTRACT

Systems, methods, and apparatus related to spike current suppression in a memory array. In one approach, a memory device includes a memory array having a cross-point memory architecture. The memory array has access lines (e.g., word lines and/or bit lines) configured to access memory cells of the memory array. Each access line has left and right portions. Spike current suppression is implemented by charge screening structures. The charge screening structures are formed by laterally integrating insulating layers into selected interior regions of the left and/or right portions of the access line. The insulating layers vertically separate the access line into top and bottom conductive portions above and below the insulating layers. For memory cells (Continued)

located overlying or underlying the insulating layers, the resistance to each memory cell is increased because the cell is accessed using only the higher resistance path of the top or bottom conductive portion. During a spike discharge, charge is choked by this higher resistance path. This suppresses spike current that occurs when the memory cell is selected.

15 Claims, 35 Drawing Sheets

(51) Int. Cl.
    *H10N 70/00*     (2023.01)
    *H10N 70/20*     (2023.01)

(52) U.S. Cl.
    CPC ............. *H10B 63/24* (2023.02); *H10B 63/80* (2023.02); *H10N 70/063* (2023.02); *H10N 70/231* (2023.02); *H10N 70/882* (2023.02); *G11C 2213/72* (2013.01)

(58) Field of Classification Search
    CPC ... H01L 27/2463; H01L 45/06; H01L 45/141; H01L 45/1675
    USPC .............................................. 365/163, 230.03
    See application file for complete search history.

(56) References Cited

U.S. PATENT DOCUMENTS

| | | | | |
|---|---|---|---|---|
| 5,691,229 | A * | 11/1997 | Okamura | H01L 27/10852 |
| | | | | 148/DIG. 14 |
| 5,936,874 | A * | 8/1999 | Clampitt | H01L 27/10873 |
| | | | | 257/E21.654 |
| 6,215,698 | B1 * | 4/2001 | Haggag | G11C 16/16 |
| | | | | 365/185.28 |
| 6,635,546 | B1 * | 10/2003 | Ning | H01L 27/222 |
| | | | | 438/238 |
| 9,761,590 | B1 * | 9/2017 | Pulugurtha | H01L 23/528 |
| 9,953,992 | B1 * | 4/2018 | Ogawa | H10B 41/41 |
| 10,431,301 | B2 | 10/2019 | Mirichigni et al. | |
| 10,566,052 | B2 | 2/2020 | Mirichigni et al. | |
| 10,629,263 | B2 | 4/2020 | Yamasaki et al. | |
| 10,910,438 | B2 | 2/2021 | Pellizzer et al. | |
| 10,978,478 | B1 * | 4/2021 | Yip | G11C 16/08 |
| 11,100,986 | B2 | 8/2021 | Wang | |
| 11,222,854 | B2 * | 1/2022 | Bohra | H01L 21/7684 |
| 11,348,640 | B1 | 5/2022 | Venkatesan et al. | |
| 11,515,205 | B2 * | 11/2022 | Ramanathan | H01L 43/12 |
| 2004/0042134 | A1 * | 3/2004 | Kim | H01L 27/11507 |
| | | | | 257/E21.664 |
| 2004/0130000 | A1 | 7/2004 | Pellizzer et al. | |
| 2005/0128786 | A1 * | 6/2005 | Ohtsuka | G11C 8/08 |
| | | | | 365/149 |
| 2005/0199925 | A1 * | 9/2005 | Kajiyama | G11C 11/16 |
| | | | | 257/E27.005 |
| 2006/0039188 | A1 * | 2/2006 | Ju | G11C 11/1655 |
| | | | | 365/158 |
| 2006/0083054 | A1 * | 4/2006 | Jeong | G11C 11/16 |
| | | | | 365/158 |
| 2007/0081387 | A1 * | 4/2007 | Lung | G11C 16/0475 |
| | | | | 365/185.18 |
| 2009/0073760 | A1 | 3/2009 | Betser et al. | |
| 2010/0096628 | A1 | 4/2010 | Song et al. | |
| 2010/0181649 | A1 * | 7/2010 | Lung | H01L 45/085 |
| | | | | 438/366 |
| 2010/0202186 | A1 | 8/2010 | Sato et al. | |
| 2010/0213526 | A1 * | 8/2010 | Wada | H01L 21/76816 |
| | | | | 257/314 |
| 2011/0024712 | A1 | 2/2011 | Chen et al. | |
| 2012/0056145 | A1 * | 3/2012 | Aoyama | H10N 70/011 |
| | | | | 257/E45.001 |
| 2012/0145986 | A1 | 6/2012 | Yasutake | |
| 2013/0094279 | A1 | 4/2013 | Kobatake | |
| 2013/0313511 | A1 * | 11/2013 | Kim | H10B 61/22 |
| | | | | 257/E25.003 |
| 2016/0104709 | A1 * | 4/2016 | Pulugurtha | G11C 11/4097 |
| | | | | 438/283 |
| 2016/0233224 | A1 * | 8/2016 | Rhie | H10B 43/10 |
| 2016/0247565 | A1 | 8/2016 | Perner et al. | |
| 2017/0092748 | A1 | 3/2017 | Ting et al. | |
| 2017/0263612 | A1 * | 9/2017 | Yamashita | H10B 43/40 |
| 2017/0338280 | A1 * | 11/2017 | Frost | H10B 63/84 |
| 2018/0082750 | A1 * | 3/2018 | Ikeda | G11C 11/005 |
| 2018/0301412 | A1 | 10/2018 | Borsari | |
| 2019/0043807 | A1 | 2/2019 | Redaelli et al. | |
| 2019/0172502 | A1 * | 6/2019 | Jeong | G11C 5/025 |
| 2019/0229125 | A1 * | 7/2019 | Zhou | H10B 41/27 |
| 2020/0020396 | A1 * | 1/2020 | Kanamori | H10N 70/8828 |
| 2020/0075854 | A1 * | 3/2020 | Park | H10N 70/826 |
| 2020/0082885 | A1 | 3/2020 | Lin et al. | |
| 2020/0090752 | A1 * | 3/2020 | Kato | H10B 41/27 |
| 2020/0161373 | A1 * | 5/2020 | Cheng | H10B 63/20 |
| 2020/0286564 | A1 * | 9/2020 | Sakaguchi | H10B 41/35 |
| 2020/0294584 | A1 * | 9/2020 | Al-Shamma | H10B 63/30 |
| 2020/0321519 | A1 | 10/2020 | Yim et al. | |
| 2020/0357761 | A1 | 11/2020 | Moore et al. | |
| 2020/0365658 | A1 | 11/2020 | Takahashi et al. | |
| 2020/0411097 | A1 * | 12/2020 | Nam | G11C 16/0483 |
| 2021/0043685 | A1 * | 2/2021 | Redaelli | H01L 21/76892 |
| 2021/0111137 | A1 * | 4/2021 | Chen | H01L 24/89 |
| 2021/0118903 | A1 * | 4/2021 | Yun | H10B 41/27 |
| 2021/0183421 | A1 * | 6/2021 | Wang | G11C 11/4097 |
| 2021/0242131 | A1 * | 8/2021 | Ong | H01L 21/76895 |
| 2021/0249601 | A1 * | 8/2021 | Lai | H01L 27/2436 |
| 2021/0280223 | A1 * | 9/2021 | Muzzetto | G11C 13/0064 |
| 2021/0305495 | A1 * | 9/2021 | Shen | H01L 43/02 |
| 2021/0366924 | A1 * | 11/2021 | Tokita | H10B 43/27 |
| 2021/0391351 | A1 * | 12/2021 | Takimoto | H10B 41/10 |
| 2022/0037400 | A1 * | 2/2022 | Li | H10B 63/80 |
| 2022/0037466 | A1 * | 2/2022 | Lee | H01L 27/10808 |

OTHER PUBLICATIONS

International Search Report and Written Opinion, PCT/US2022/021416, dated Jul. 8, 2022.

* cited by examiner

CHARGE SCREENING STRUCTURE FOR SPIKE CURRENT SUPPRESSION IN A MEMORY ARRAY

RELATED APPLICATIONS

The present application is a continuation of U.S. patent application Ser. No. 17/222,874, filed Apr. 5, 2021, issued as U.S. Pat. No. 11,348,640 on May 31, 2022, and entitled "CHARGE SCREENING STRUCTURE FOR SPIKE CURRENT SUPPRESSION IN A MEMORY ARRAY," the entire disclosure of which application is hereby incorporated herein by reference.

FIELD OF THE TECHNOLOGY

At least some embodiments disclosed herein relate to memory devices in general, and more particularly, but not limited to a charge screening structure for spike current suppression in a memory array.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory devices (e.g., FeRAM) may maintain their stored logic state for extended periods of time even in the absence of an external power source. Volatile memory devices (e.g., DRAM) may lose their stored state when disconnected from an external power source.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
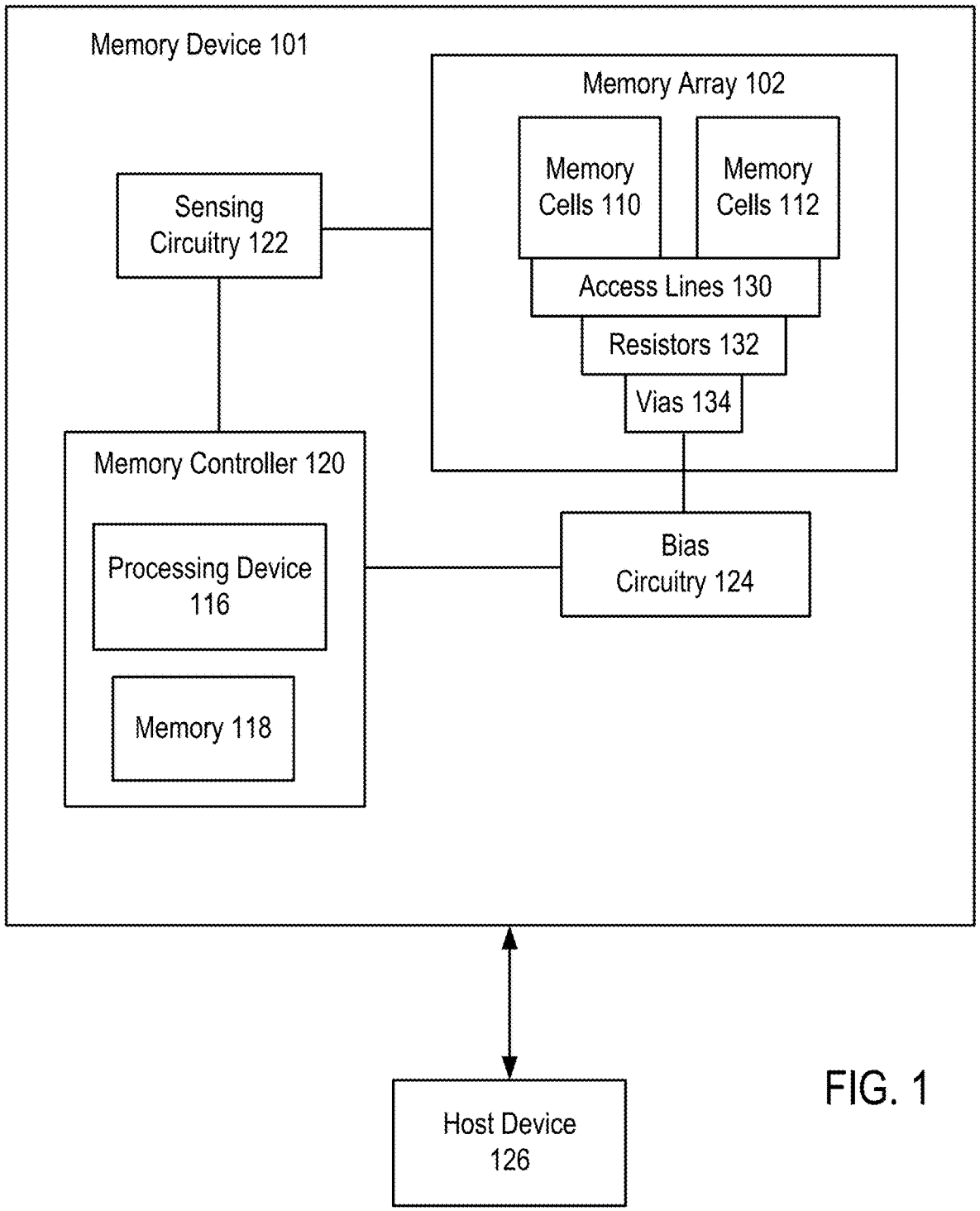
FIG. 1 shows a memory device that implements spike current suppression in a memory array, in accordance with some embodiments.

The following disclosure describes various embodiments for spike current suppression in a memory array. At least some embodiments herein relate to a memory device having a memory array that uses a cross-point architecture. In one example, the memory array is a resistive RAM (RRAM) cross-point memory array, or a ferroelectric RAM (FeRAM) cross-point memory array. Other memory types may be used.

In one example, the memory device stores data used by a host device (e.g., a computing device of an autonomous vehicle, an artificial intelligence (AI) engine, or other computing device that accesses data stored in the memory device). In one example, the memory device is a solid-state drive mounted in an electric vehicle.

In some memory arrays (e.g., a cross-point memory array), current discharges through a memory cell may result in current spikes (e.g., relatively high current discharge through the memory cell in a relatively short time period), which may cause damage to the memory cell. For example, current discharge that occurs when a chalcogenide memory cell snaps can result in amorphization of the memory cell. Such spikes may result from internal discharge within the memory array. In one example, this is the discharge of parasitic capacitances within the memory array. Current spikes due to internal discharge may be particularly problematic.

In one example, memory cells are selected by generating voltages on word and bit lines of the memory array. When the memory cell is selected, a large current spike can flow through the cell. The spike is caused by parasitic capacitances that have accumulated charge during operation of the memory device. The charge is discharged as a current spike that can cause damage to the memory cell.

In one example, the memory cell is a chalcogenide-based self-selecting memory cell that snaps when selected (e.g., the cell is in a SET state). A selection spike results from discharge of parasitic capacitances coupled to the word and/or bit line that are used to select the memory cell. Memory cells that use both a select device and a memory storage element (e.g., phase change memory) can suffer from similar problems.

This selection spike can be a root cause of several reliability mechanisms. This is particularly true for memory cells that are located near a decoder, for which spike current is typically greater. For example, the selection spikes cause reliability mechanisms such as read disturb and/or endurance degradation.

In one example, various voltages of a memory array may be altered to perform access operations. The various voltage alterations may cause charge in the memory array to build up, for example, in the parasitic capacitances associated with the array (e.g., the parasitic capacitances of the access lines of the memory array). In some cases, the built-up charge may discharge through a selected memory cell. For example, a memory cell may become conductive based on being selected (e.g., when accessed, such as when a voltage across the memory cell crosses a threshold voltage of the memory cell), which may allow built-up charge on the access lines coupled with the memory cell to discharge through the cell in a current spike (e.g., a current spike having a peak magnitude of at least 100 microamps, such as 200-300 microamps). The memory cell may be degraded or worn out in proportion to the number and magnitude of current spikes experienced by the memory cell over time.

In one example, a memory array uses self-selecting chalcogenide memory cells. As cells are selected, word and bit lines are charged up to select the cells. This can cause capacitive coupling to adjacent word or bit lines for adjacent cells. Over time, this capacitive coupling causes electrical charge to accumulate in various parasitic capacitances (e.g., such as mentioned above). When the memory cell is selected and snaps (e.g., during a read operation), the accumulated electrical charge flows through the memory cell as a current spike.

In some cases, current spikes may be higher for memory cells located close or near to a via that connects to an access line driver (e.g., a near electrical distance (ED)) than for memory cells located far from the via/driver (e.g., a far ED). For example, discharge through a memory cell with a near ED may be more severe due to a relatively lower resistance path between the memory cell and the charge built up in parasitic capacitances along the entire length of the access line, which may result in a higher amount of current through the memory cell when the memory cell becomes conductive (e.g., a relatively higher magnitude current spike) than for memory cells with far ED, which may be more separated from charge built up along farther away portions of the access line (e.g., charge built up far along the access line on the other side of the via).

To address these and other technical problems, one or more resistors are used to screen electrical discharge from portions of an access line other than the portion being used to access a memory cell. The screening of the electrical discharge by the one or more resistors reduces the extent of electrical discharge that would occur in the absence of resistors (e.g., the lack of such resistors in prior devices).

The physical configuration of the resistors can be customized depending, for example, on the location of the access line in a memory array. In one example, each resistor is a portion of a resistive film located between the access line and a via that is electrically connected to a driver used to drive voltages on the access line when selecting the memory cell.

In one example, the access line is a word line of a cross-point memory array. The one or more resistors are configured to increase the resistance of a circuit path through which parasitic capacitance(s) of the cross-point memory array may discharge so that the magnitude of any current spike is reduced. The magnitude of the current spike is lower as compared to prior approaches in which the resistors are not used (e.g., the resistors increase the resistance of the RC discharge circuit, which reduces the current spike). Also, the use of the one or more resistors has minimal impact on the ability to bias and deliver current to the word line for normal memory cell operations such as reading, writing, etc.

In one embodiment, an access line is split into left and right portions (e.g., left and right word line or bit line portions). Each portion is electrically connected to a via, which a driver uses to generate a voltage on the access line. To reduce electrical discharge associated with current spikes, a first resistor is located between the left portion and the via, and a second resistor is located between the right portion and the via.

In some embodiments, spike current suppression is implemented by using a socket structure that is formed in an access line, as discussed in more detail below (see, e.g., FIG. 14 and the related discussion below). In one embodiment, a socket of the access line is filled with a conductive layer, and two resistive films are formed in the access line on each side of the conductive layer.

In other embodiments, spike current suppression is implemented by using one or more charge screening structures, as discussed in more detail below (see, e.g., FIGS. 26 and 27, and the related discussion below). In one embodiment, the charge screening structures are formed by integrating insulating layers into interior regions of an access line (e.g., insulating layers extending laterally in the middle of certain portions of the access line). The insulating layers vertically split the access line into top and bottom conductive portions. For those memory cells that are located overlying and/or underlying one of the insulating layers, the resistance of the electrical path to each memory cell is increased because the thickness of the top or bottom conductive portion is less than the thickness of those portions of the access line where the insulating layers are not present. Thus, during a spike discharge, charge is choked by the higher resistance path to the memory cell. For example, this suppresses spike current that may occur when one of the overlying and/or underlying memory cells is selected (e.g., a chalcogenide memory cell snaps).

One advantage of the charge screening structure is that via resistance does not need to be increased, so that delivery of current to memory cells located far from the via is minimally affected. For example, the top and bottom conductive portions are both used for far current delivery, such that the combined electrical paths have a resistance that is substantially similar to that of the portions of the access line without insulating layers.

In one embodiment, a memory device includes a memory array having a cross-point memory architecture. The memory array has an access line configured to access memory cells of the memory array. The access line has a first portion and a second portion on opposite sides of a central region of the access line. The first portion is configured to access a first memory cell, and the second portion configured to access a second memory cell. In one example, the access line is a word line or bit line, and the central region is in the middle of the word or bit line. In one example, the access line is split into left and right portions as mentioned above.

One or more vias are electrically connected at the central region to the first portion and the second portion. In one example, a single via is used. In other examples, multiple vias can be used.

A first resistor is located between the first portion of the access line and the via. The first resistor is configured so as to screen electrical discharge from the first portion when accessing the second memory cell. A second resistor is located between the second portion and the via. The second resistor is configured to screen electrical discharge from the second portion when accessing the first memory cell.

A driver is electrically connected to the one or more vias. The driver is configured to generate a voltage on the first portion when accessing the first memory cell. The driver generates a voltage on the second portion when accessing the second memory cell. In one example, the driver is a word line or bit line driver. In one example, the driver is electrically connected to a single via in the middle of a word line, and a voltage is generated on both the first and second portions when accessing a single memory cell. The memory cell can be located on either the first or second portion.

Various advantages are provided by embodiments described herein. In one advantage, current spikes that result during selection of a memory cell are suppressed by screening charge from far capacitances in a memory array (e.g., charge from far cells on a left portion of an access line in a left half tile used to access a near memory cell, and/or charge from a right portion of the access line in the right half tile). In one advantage, the resistors above can readily be added on an existing quilt architecture.

In one advantage, use of the resistors above can be varied for different locations of the memory array. The layers used to form the memory cell stack can be the same for all portions of the memory array. Thus, the use of the spike current suppression as described herein can be transparent to memory cell structure.

In one advantage, for a given level of tolerable current spike, tile size and thus memory density can be increased. In one advantage, various different resistor configurations can be combined and varied as desired for different portions of a memory array. In one advantage, the spike current suppression can be generally used for any cross-point technology.

FIG. 1 shows a memory device 101 that implements spike current suppression in a memory array 102 of memory device 101, in accordance with some embodiments. Memory device 101 includes memory controller 120, which controls sensing circuitry 122 and bias circuitry 124. Memory controller 120 includes processing device 116 and memory 118. In one example, memory 118 stores firmware that executes on processing device 116 to perform various operations for memory device 101. In one example, the operations include reading and writing to various memory cells of memory array 102.

The memory cells of memory array 102 include memory cells 110 and memory cells 112. In one example, memory cells 110 are located in a left half tile and memory cells 112 are located in a right half tile of the memory array.

Access lines 130 of memory array 102 are used to access memory cells 110, 112. In one example, access lines 130 are word lines and/or bit lines. In one example, each access line 130 is split in a central region (e.g., the middle of the access line) to have a left portion that accesses memory cells 110 and a right portion that accesses memory cells 112.

Bias circuitry 124 is used to generate voltages on access lines 130. Vias 134 are used to electrically connect access lines 130 to bias circuitry 124. In one example, a single via 134 is used to electrically connect a left portion and a right portion of each access line 130 to a word or bit line driver of bias circuitry 124.

In one example, a voltage is driven on a left portion of an access line 130 to access a memory cell 110. In one example, the voltage is driven as part of a read or write operation performed in response to a command received from host device 126.

Sensing circuitry 122 is used to sense current flowing through memory cells 110, 112. In one example, sensing circuitry 122 senses a current that results from applying a voltage to a memory cell 110 during a read operation.

In one embodiment, in order to suppress spike currents in memory array 102, various resistors 132 are located between access lines 130 and vias 134. The resistors 132 screen electrical discharge (e.g., as described above) from certain portions of access lines 130 that can occur when a memory cell 110, 112 is accessed (e.g., when a chalcogenide memory cell snaps).

In one embodiment, memory device 101 selects write voltages for applying to memory cells 110, 112 when performing write operations. In one embodiment, bias circuitry 124 is implemented by one or more voltage drivers. Bias circuitry 124 may further be used to generate read voltages for read operations performed on memory array 102 (e.g., in response to a read command from host device 126).

In one embodiment, sensing circuitry 122 is used to sense a state of each memory cell in memory array 102. In one example, sensing circuitry 122 includes current sensors (e.g., sense amplifiers) used to detect a current caused by applying various read voltages to memory cells in memory array 102. Sensing circuitry 122 senses a current associated with each of the memory cells 110 caused by applying the voltage.

In one example, if sensing circuitry 122 determines that the respective current resulting from applying a read voltage to the memory cell is greater than a respective fixed threshold (e.g., a predetermined level of current or threshold current), then memory controller 120 determines that the memory cell has snapped.

In one embodiment, memory cells 110, 112 can be of different memory types (e.g., single level cell, or triple level cell).

In one embodiment, memory controller 120 receives a write command from a host device 126. The write command is accompanied by data (e.g., user data of a user of host device 126) to be written to memory array 102. In response to receiving the write command, controller 120 initiates a programming operation by applying voltages to memory cells 110. Controller 120 determines respective currents resulting from applying the voltages.

In one embodiment, controller 120 determines whether the existing programming state (e.g., logic state zero) and the target programming state (e.g., logic state zero) for each cell are equal. If the existing and target programming states are equal, then no write voltage is applied (e.g., this is a normal write mode). If the existing and target programming states are different, then a write voltage is applied to that particular memory cell. In one example, the write voltage is 3-8 volts applied across the memory cell by applying voltage biases to the word line and bit line used to select the cell.

In one example, controller 120 may use write voltages (e.g., write pulses) to write a logic state to a memory cell, such as memory cell 110, 112 during the write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

Figure 2:
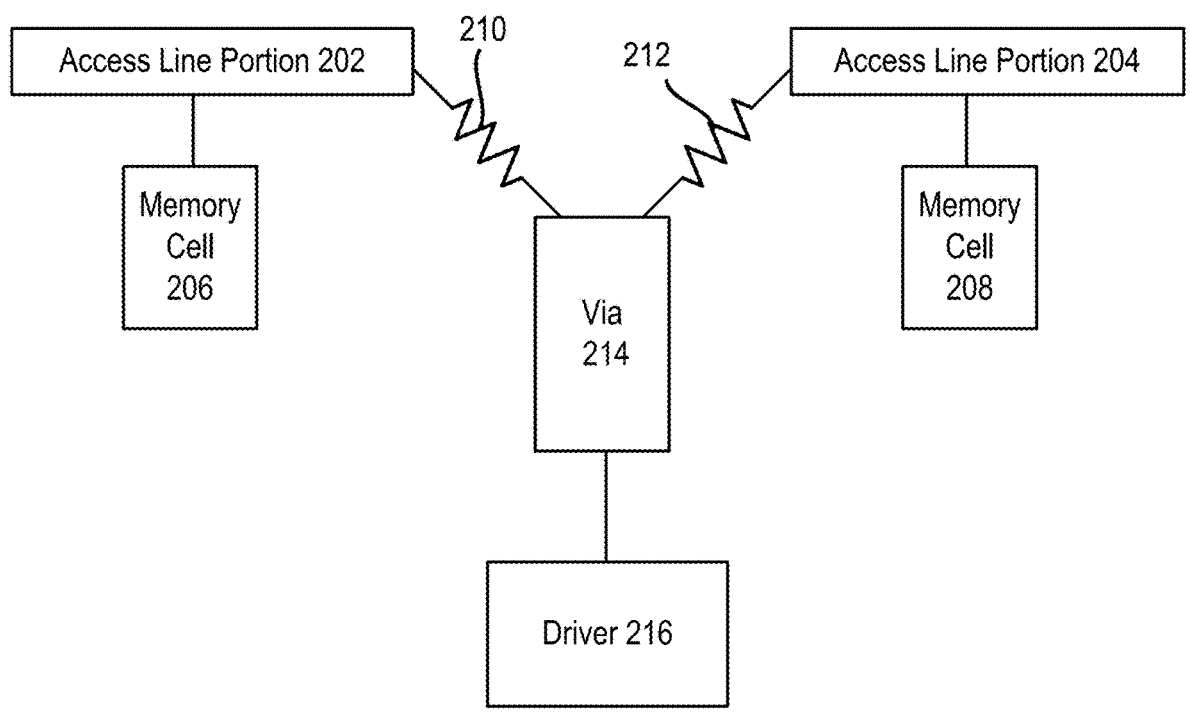
FIG. 2 shows resistors used to implement spike current suppression for an access line of a memory array, in accordance with some embodiments.

FIG. 2 shows resistors 210, 212 used to implement spike current suppression for an access line of a memory array, in accordance with some embodiments. The access line has a first portion 202 and a second portion 204 (e.g., left and right portions as described above). The access line of FIG. 2 is an example of an access line 130 of memory array 102. Portion 202 is used to access memory cell 206, and portion 204 is used to access memory cell 208. Each portion 202, 204 is typically used to access multiple memory cells (e.g., memory cells located in the memory array above and below the respective portion).

Access line portions 202, 204 are electrically connected to via 214 by resistors 210, 212. In one example, access line portions 202, 204 are portions of a conductive layer in a memory array. In one example, resistors 210, 212 are portions of a resistive film formed underlying the conductive layer and overlying via 214.

In one example, via 214 is a single via. In one example, via 214 is provided by multiple vias. Via 214 electrically connects driver 216 to access line portions 202, 204. Driver 216 is an example of bias circuitry 124. In one example, driver 216 generates a read voltage on portion 202 in order to determine a state of memory cell 206. In one example, driver 216 generates a read voltage on portion 204 in order to determine a state of memory cell 208.

Memory cells 206, 208 may be formed using various memory cell types. In one example, the memory cell includes chalcogenide. In one example, the memory cell includes a select device, and a phase change material as a memory element. In one example, the memory cell is a self-selecting memory cell including chalcogenide. In one example, the memory cell is a resistive memory cell.

Figure 3:
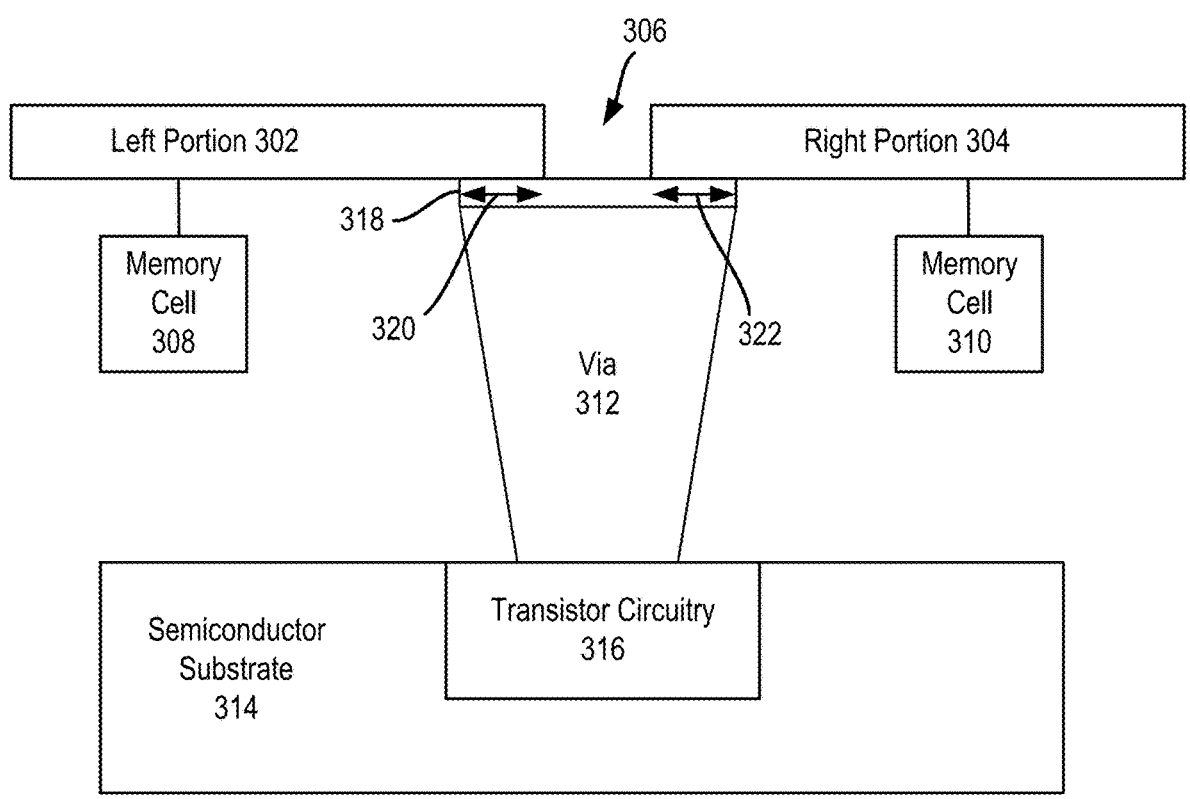
FIG. 3 shows an access line split into left and right portions for spike current suppression, in accordance with some embodiments.

FIG. 3 shows an access line split into left and right portions 302, 304 for spike current suppression, in accordance with some embodiments. Left portion 302 is used to access memory cell 308, and right portion 304 is used to access memory cell 310. The access line provided by portions 302, 304 is an example of an access line 130 of FIG. 1, or the access line of FIG. 2.

In one embodiment, a split in the access line is provided in a central region 306 of the access line. In one example, the split is formed in the middle of the access line so that portions 302 and 304 are patterned to have substantially equal or identical lengths. In one example, portions 302 and 304 are patterned to have different lengths.

Left and right portions 302, 304 are electrically connected to via 312 by a resistive film 318. Resistive film 318 has a section 320 located between left portion 302 of the access line and via 312. Resistive film 318 has a section 322 located between right portion 304 of the access line and via 312.

In one example, each of sections 320, 322 has a thickness of 1 to 20 nanometers. In one example, each of sections 320, 322, has a width of 10 to 200 nanometers. The width is indicated in FIG. 3 by the arrows corresponding to reference numbers 320, 322.

In one example, resistive film 318 includes tungsten silicon nitride. In one example, resistive film 318 includes one or more of tungsten silicon nitride, titanium silicide nitride, tungsten nitride, titanium nitride, tungsten silicide, or cobalt silicide. The proportions of the foregoing materials can be varied for different memory arrays.

In one embodiment, the split is a gap that physically separates portions 302, 304. In one example, the split includes a non-conductive material formed in central region 306 between portions 302 and 304. In one example, the non-conductive material is an insulating oxide. In one example, the split is an unfilled space between portions 302, 304.

Via 312 is electrically connected to transistor circuitry 316, which is formed in a semiconductor substrate 314. In one example, transistor circuitry 316 includes bias circuitry 124. In one example, transistor circuitry 316 includes one or more voltage drivers to generate voltages on portions 302, 304 of the access line shown in FIG. 3. In one example, transistor circuitry 316 is formed using CMOS transistors.

Figure 4:
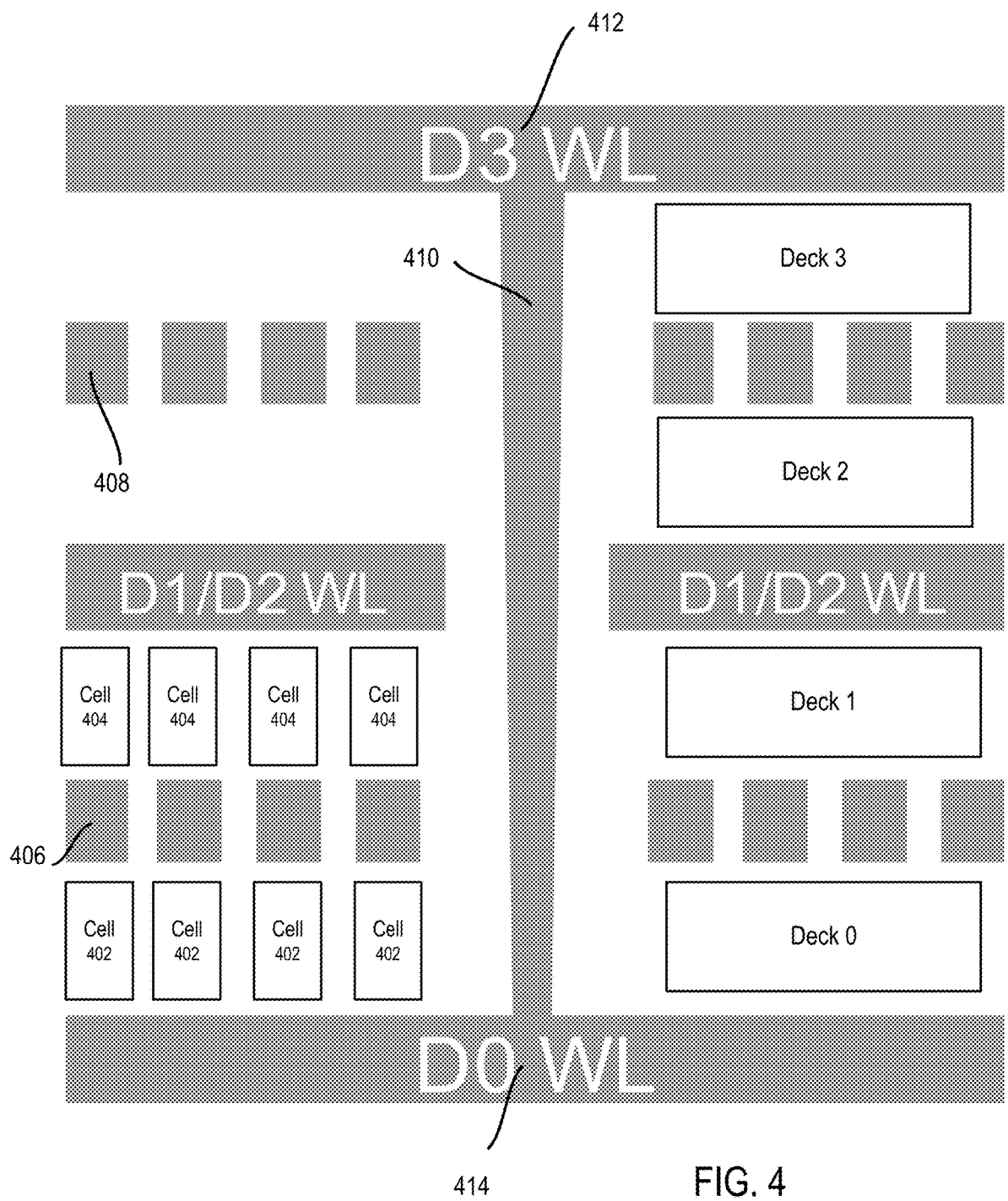
FIG. 4 shows a memory array in a cross-point architecture including various word line and bit line layers that provide access to memory cells arranged in multiple stacked decks, in accordance with some embodiments.

FIG. 4 shows a memory array in a cross-point architecture including various word line and bit line layers that provide access to memory cells arranged in multiple stacked decks, in accordance with some embodiments. The memory array includes various word lines and bit lines arranged orthogonally (e.g., perpendicularly) to one another. For example, word lines 412, 414 are arranged perpendicularly to bit lines 406, 408. Word lines 412, 414 are an example of access lines 130 of FIG. 1. Additionally and/or alternatively, bit lines 406, 408 are an example of access lines 130.

The memory array includes various memory cells arranged in various decks (e.g., Decks 0-3). Each deck includes memory cells. For example, Deck 0 includes memory cells 402, and Deck 1 includes memory cells 404. Memory cells 402, 404 are an example of memory cells 110. In one embodiment, each bit line 406 provides access to memory cells 402, 404, which are located above and below the respective bit line.

Although not shown for purposes of simplified illustration, each of word lines 412, 414 may incorporate resistors 210, 212 described above. In one example, each of word lines 412, 414 is split to have a left portion 302 and a right portion 304, similarly as discussed above. In one example, each word line and/or bit line for any or all of the Decks 0-3 can include a split, such as discussed above for FIG. 3. In one example, various configurations of resistors 210, 212 can be used for different word lines and/or bit lines. In one example, the configuration for resistors 210, 212 is determined based on an extent of electrical discharge associated with a given region of the memory array.

In one embodiment, word line 412 is electrically connected to word line 414 by via 410. Via 410 is an example of via 134, 214, 312.

Although not shown for purposes of simplified illustration, via 410 is electrically connected to a driver used to generate a voltage on word lines 412, 414. In one example, the driver is bias circuitry 124 or driver 216.

Figure 5:
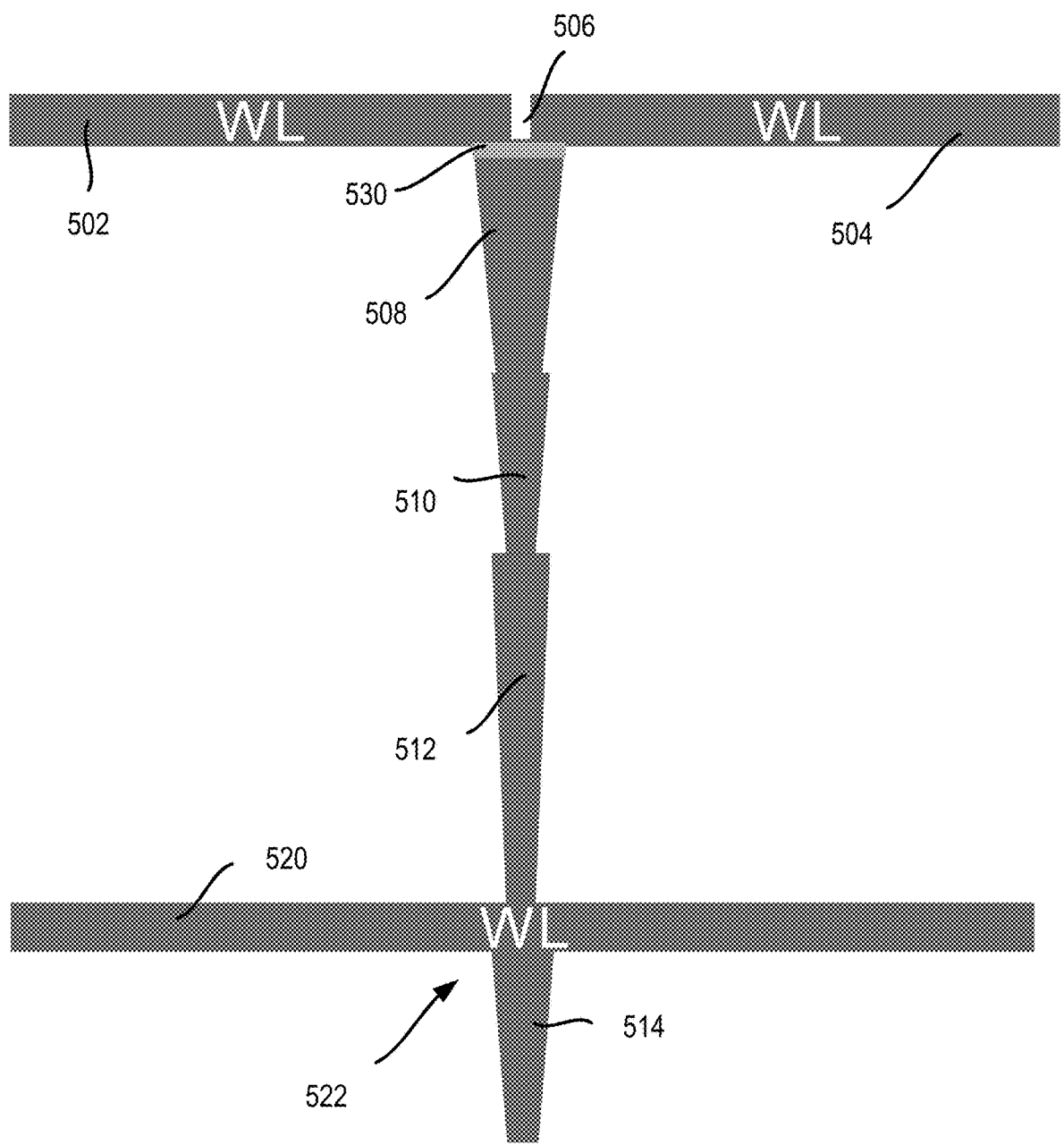
FIG. 5 shows word lines in a memory array electrically connected by a via, in accordance with some embodiments.

FIG. 5 shows word lines in a memory array electrically connected by a via, in accordance with some embodiments. In one embodiment, a word line that provides access to memory cells in a top deck of the memory array has left and right portions 502, 504, which are separated by a split 506. Left and right portions 502, 504 are an example of left and right portions 302, 304. Word line 520 provides access to memory cells in a bottom deck of the memory array.

In one embodiment, a via electrically connects left and right portions 502, 504 to word line 520. In one example, the via includes conductive portions 508, 510, 512, which are electrically connected by via 514 to a driver (not shown). In one example, each of conductive portions 508, 510, 512 corresponds to a conductive layer that is patterned and formed using, for example, a photoresist layer when manufacturing the memory array. In one example, conductive portion 510 is a landing pad for conductive portion 508.

In one embodiment, resistive film 530 electrically connects left and right portions 502, 504 to conductive portion 508. Resistive film 530 is an example of resistive film 318.

In one embodiment, a split (not shown) may be formed above via 514 in central region 522 of word line 520. Word line 520 is an example of word line 414.

Figure 6:
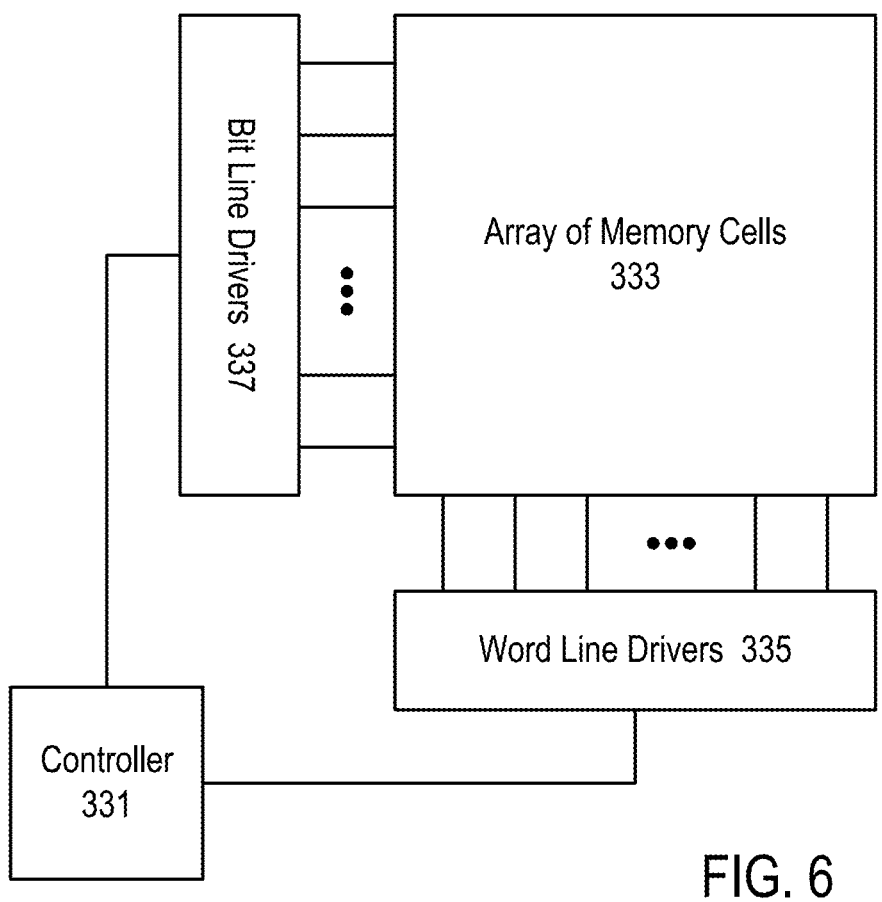
FIG. 6 shows a memory device configured with drivers to generate voltages on access lines of a memory array, in accordance with some embodiments.

FIG. 6 shows a memory device configured with drivers to generate voltages on access lines of a memory array 333, in accordance with some embodiments. For example, memory cells 206, 208 illustrated in FIG. 2 can be used in the memory cell array 333.

The memory device of FIG. 6 includes a controller 331 that operates bit line drivers 337 and word line drivers 335 to access the individual memory cells (e.g., 206, 208) in the array 333. Controller 331 is an example of memory controller 120. Memory array 333 is an example of memory array 102.

The bit line drivers 337 and/or the word line drivers 335 can be implemented by bias circuitry 124. In one example, each memory cell (e.g., 206, 208) in the array 333 can be accessed via voltages driven by a pair of a bit line driver and a word line driver, as illustrated in FIG. 7.

Figure 7:
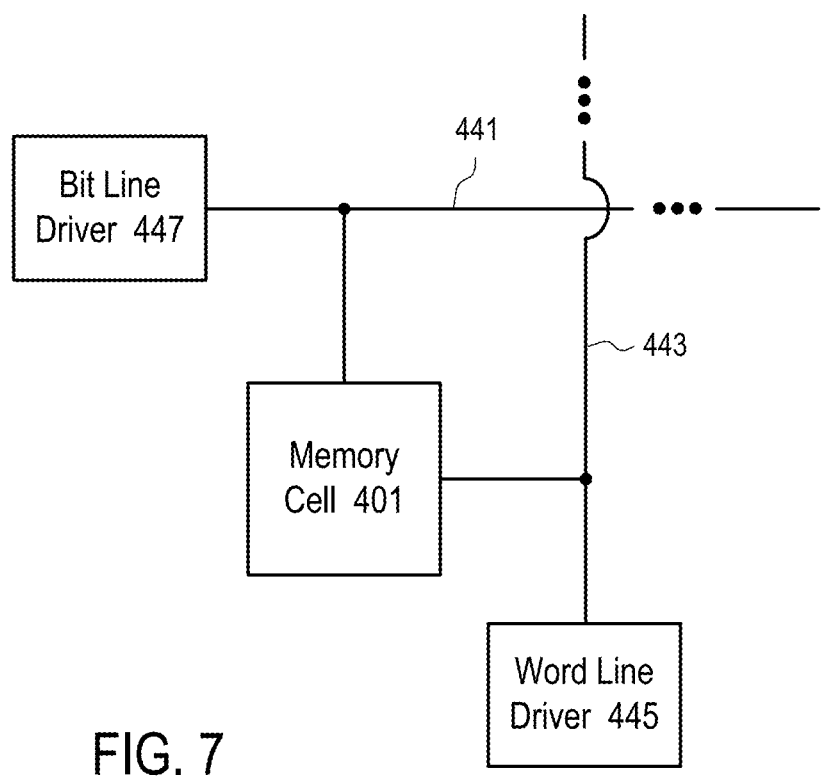
FIG. 7 shows a memory cell with a bit line driver to generate a voltage on a bit line, and a word line driver to generate a voltage on a word line, in accordance with some embodiments.

FIG. 7 shows a memory cell 401 with a bit line driver 447 to generate a voltage on a bit line (wire 441), and a word line driver 445 to generate a voltage on a word line (wire 443), in accordance with some embodiments. For example, the bit line driver 447 drives a first voltage applied to a row of memory cells in the array 333; and the word line driver 445 drives a second voltage applied to a column of memory cells in the array 333. A memory cell 401 in the row and column of the memory cell array 333 is subjected to the voltage difference between the first voltage driven by the bit line driver 447 and the second voltage driven by the word line driver 445. When the first voltage is higher than the second voltage, the memory cell 401 is subjected to one voltage polarity (e.g., positive polarity); and when the first voltage is lower than the second voltage, the memory cell 401 is subjected to an opposite voltage polarity (e.g., negative polarity).

For example, when the memory cell 401 is configured to be read with positive voltage polarity, the bit line driver 447 can be configured to drive a positive voltage. For example, when the memory cell 401 is configured to be read with negative voltage polarity, the word line driver 445 can be configured to drive a positive voltage.

For example, during the write operation, both the bit line driver 447 and the word line driver 445 can drive voltages of differing magnitudes (e.g., to perform read or write steps). For example, the bit line driver 447 can be configured to drive a positive voltage with differing magnitudes; and the word line driver 445 can be configured to drive a negative voltage with differing magnitudes. The difference between the voltage driven by the bit line driver 447 and the voltage driven the word line driver 445 corresponds to the voltage applied on the memory cell 401.

In one example, the bit line drivers 337 can be used to drive parallel wires (e.g., 441) arranged in one direction and disposed in one layer of cross-point memory; and the word line drivers 435 can be used to drive parallel wires (e.g., 443) arranged in another direction and disposed in another layer of a cross-point memory. The wires (e.g., 441) connected to the bit line drivers (e.g., 447) and the wires (e.g., 443) connected to the word line drivers (e.g., 445) run in the two layers in orthogonal directions. The memory cell array 333 is sandwiched between the two layers of wires; and a memory cell (e.g., 401) in the array 333 is formed at a cross point of the two wires (e.g., 441 and 443) in the integrated circuit die of the cross-point memory.

Figure 8:
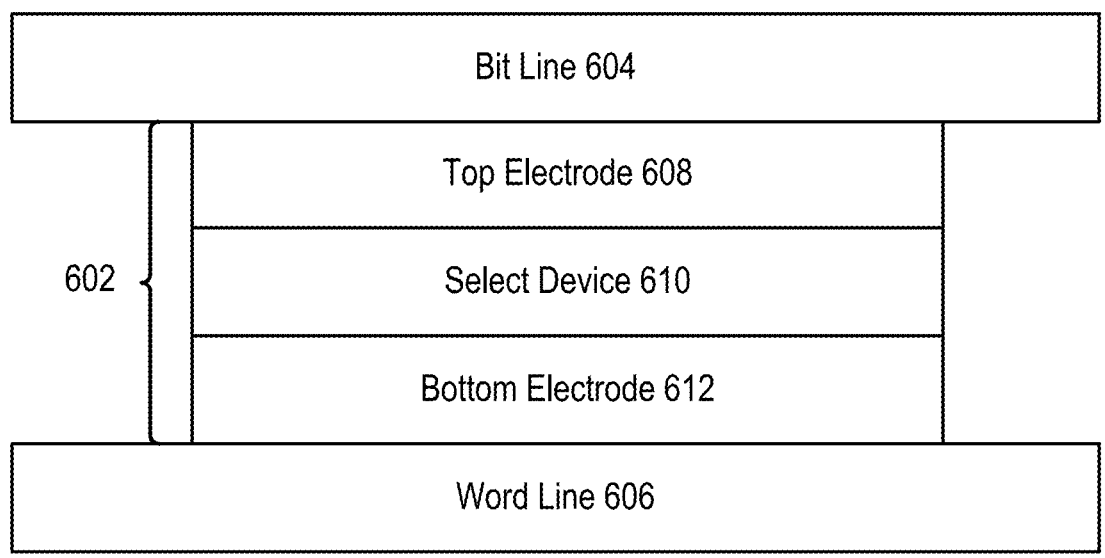
FIG. 8 shows an example of a memory cell that includes a select device, in accordance with some embodiments.

FIG. 8 shows an example of a memory cell that includes a select device 610, in accordance with some embodiments. In one example, select device 610 includes a chalcogenide. Memory cell 602 is an example of memory cells 110, 112; or memory cells 206, 208.

Top electrode 608 conductively connects select device 610 to bit line 604, and bottom electrode 612 conductively connects select device 610 to word line 606. In one example, electrodes 608, 612 are formed of a carbon material. Bit line 604 and word line 606 are each an example of an access line 130. In one example, word line 606 and/or bit line 604 is split into left and right portions 302, 304 as described herein.

In one example, select device 610 includes a chalcogenide (e.g., chalcogenide material and/or chalcogenide alloy). Threshold voltage properties of the select device may be based on the voltage polarities applied to the memory cell.

In one example, a logic state may be written to memory cell 602, which may correspond to one or more bits of data. A logic state may be written to the memory cell by applying voltages of different polarities at different voltage and/or current magnitudes. The memory cell may be read by applying voltages of a single polarity. The writing and reading protocols may take advantage of different threshold voltages of the select device that result from the different polarities. The chalcogenide material of the select device may or may not undergo a phase change during reading and/or writing. In some cases, the chalcogenide material may not be a phase change material.

In one embodiment, an apparatus includes: a memory array (e.g., 102, 333) including an access line (e.g., 130) configured to access memory cells (e.g., 206, 208; 308, 310) of the memory array, the access line having a first portion (e.g., 202, 302) and a second portion (e.g., 204, 304) on opposite sides of a central region (e.g., 306) of the access line, where the first portion is configured to access a first memory cell, and the second portion configured to access a second memory cell; at least one via (e.g., 214, 312) electrically connected at the central region to the first portion and the second portion; a first resistor (e.g., 210) located between the first portion and the via, where the first resistor is configured to screen electrical discharge from the first portion when accessing the second memory cell; a second resistor (e.g., 212) located between the second portion and the via, where the second resistor is configured to screen electrical discharge from the second portion when accessing the first memory cell; and a driver (e.g., 216) electrically connected to the via, where the driver is configured to generate a voltage on the first portion to access the first memory cell, and to generate a voltage on the second portion to access the second memory cell.

In one embodiment, the at least one via is a single via; the access line is a bit line or a word line; and the driver is a bit line driver or a word line driver.

In one embodiment, the first resistor is provided by a first section (e.g., 320) of a resistive film (e.g., 318) overlying the via; and the second resistor is provided by a second section (e.g., 322) of the resistive film overlying the via. The central region includes a split in the access line overlying the via and between the first and second portions of the access line.

In one embodiment, the resistive film includes tungsten silicon nitride.

In one embodiment, the split is formed by removing a third portion of the access line to physically separate the first portion from the second portion; and prior to removing the third portion, the third portion is located between the first portion and the second portion.

In one embodiment, the split includes: a non-conductive material configured to inhibit current discharge from flowing directly between the first and second portions of the access line; or an unfilled space between the first portion and the second portion.

In one embodiment, the memory array is part of a memory device (e.g., 101); the access line is associated with a physical address within the memory array; and an access operation by a controller (e.g., 120) of the memory device to select the first memory cell addresses both the first and second portions of the access line.

In one embodiment, an apparatus includes: an access line having a first portion (e.g., 302) and a second portion (e.g., 304), where the first portion is configured to access a memory cell (e.g., 308) of a memory array, and a gap physically separates the first portion and the second portion; a via (e.g., 312) electrically connected to the first portion and the second portion; and a resistive film (e.g., 318) having a first section between the first portion and the via, and a second section between the second portion and the via.

In one embodiment, the apparatus further includes a driver (e.g., a driver in transistor circuitry 316) electrically connected to the via, where the driver is configured to generate a voltage on the first portion to access the memory cell.

In one embodiment, the gap is a split in the access line formed by removing a third portion of the access line to physically separate the first portion of the access line from the second portion.

In one embodiment, a material forming the resistive film has a higher resistivity than a material forming the first and second portions of the access line.

In one embodiment, the resistive film includes at least one of: tungsten silicon nitride; titanium silicide nitride; tungsten nitride; titanium nitride; tungsten silicide; or cobalt silicide.

In one embodiment, each of the first and second portions is configured to access memory cells located above and below the respective portion.

In one embodiment, the memory array has a cross-point architecture, and the memory cell is: a memory cell including chalcogenide; a memory cell including a select device, and a phase change material as a memory element; a self-selecting memory cell including chalcogenide (e.g., memory cell 602); or a resistive memory cell.

In one embodiment, the gap overlies a third section of the resistive film (e.g., the middle section of resistive film 318 located under central region 306), and the third section is positioned between the first section and the second section.

FIGS. 9-12 show various steps in the manufacture of a memory device that implements spike current suppression, in accordance with some embodiments. In one example, the memory device is memory device 101.

Figure 9:
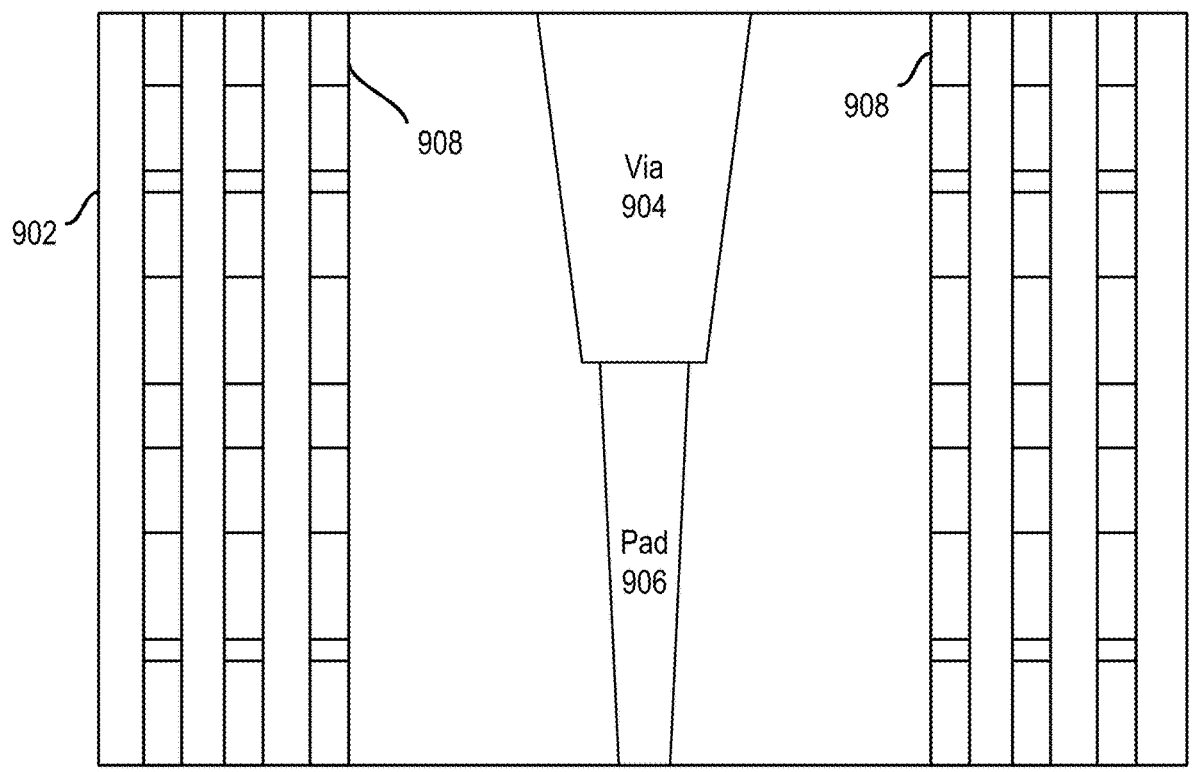
FIGS. 9-12 show various steps in the manufacture of a memory device that implements spike current suppression, in accordance with some embodiments.

FIG. 9 shows a memory array 902 at an intermediate stage of manufacture. Memory array 902 includes various memory cells 908. Each memory cell 908 includes a memory stack containing various layers of materials (e.g., chalcogenide, phase change material, etc.) corresponding to the memory cell technology that has been chosen for use. Memory cells 908 are an example of memory cells 110, 112; memory cells 206, 208; or memory cells 308, 310.

Memory array 902 includes a via 904 that has been formed on a pad 906. Memory array 902 as shown in FIG. 9 can be formed using conventional manufacturing techniques.

Figure 10:
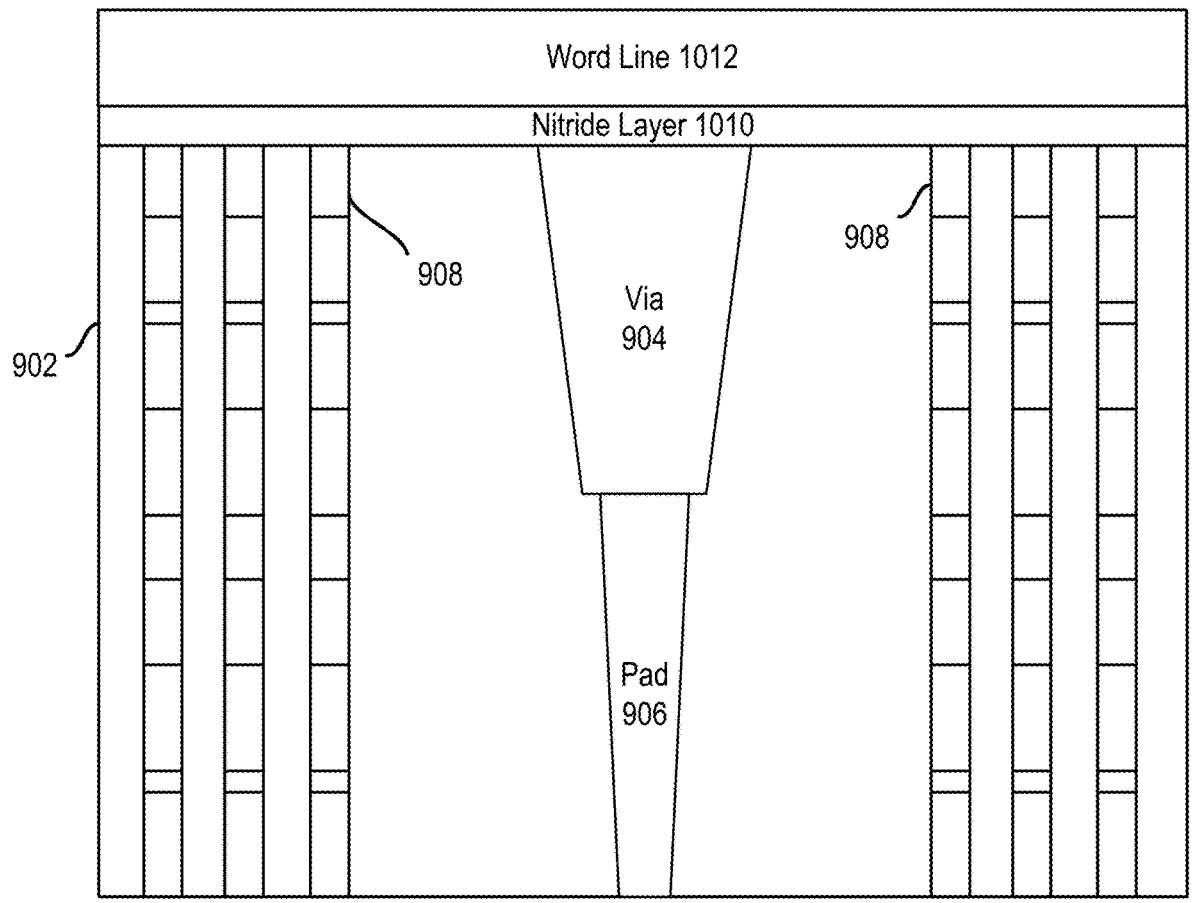

As shown in FIG. 10, a nitride layer 1010 is formed overlying a top surface of memory array 902. In one example, nitride layer 1010 includes one or more of tungsten silicon nitride, titanium silicide nitride, tungsten nitride, or titanium nitride. In one example, one or more of tungsten silicide or cobalt silicide can be alternatively or additionally used. The proportions of the foregoing materials can be varied for different memory arrays.

A word line 1012 is formed overlying nitride layer 1010. In one example, word line 1012 is a conductive material. In one example, word line 1012 is tungsten.

Figure 11:
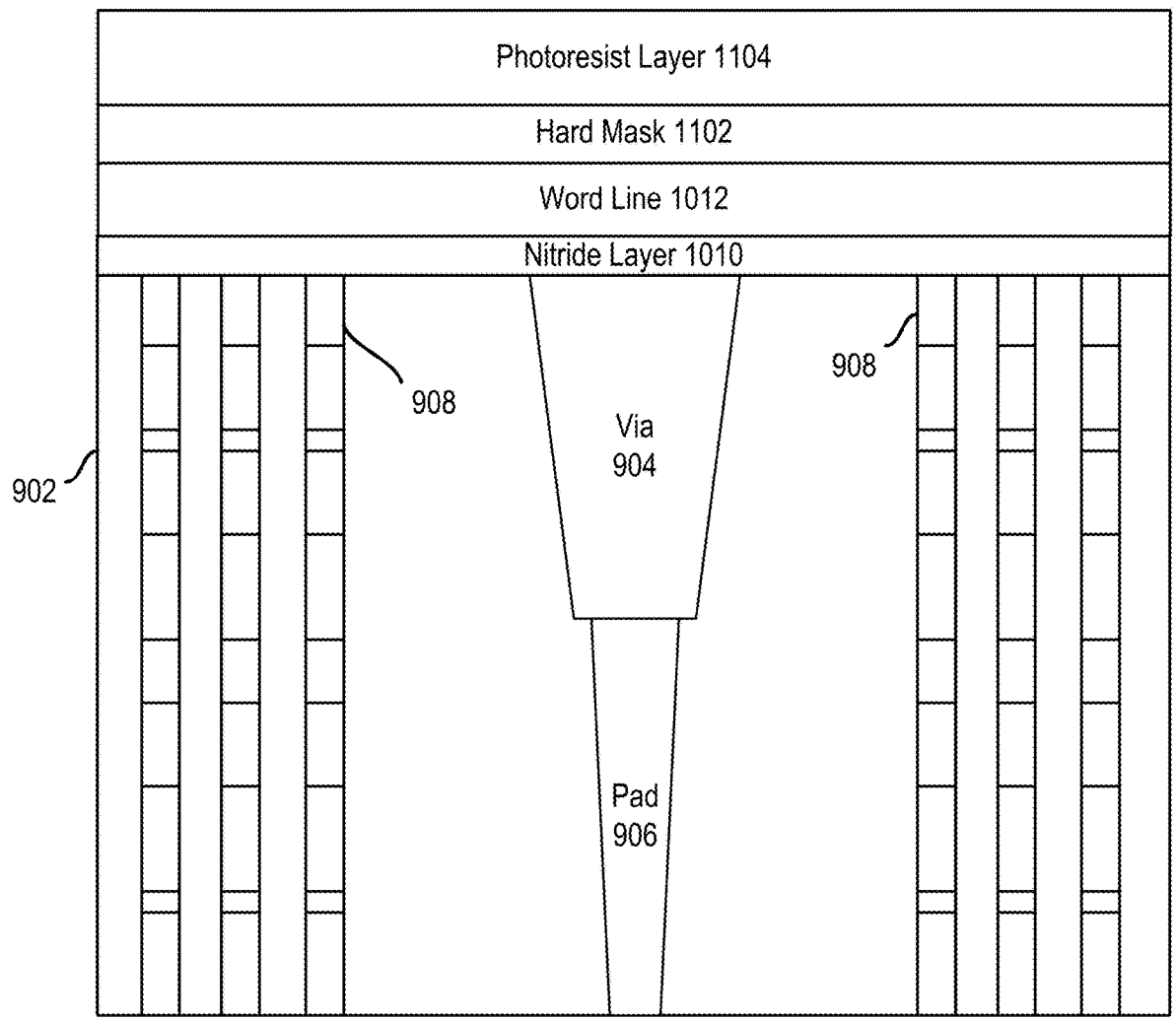

As shown in FIG. 11, a hard mask 1102 is formed overlying word line 1012. Then, a photoresist layer 1104 is formed overlying hard mask 1102.

Figure 12:
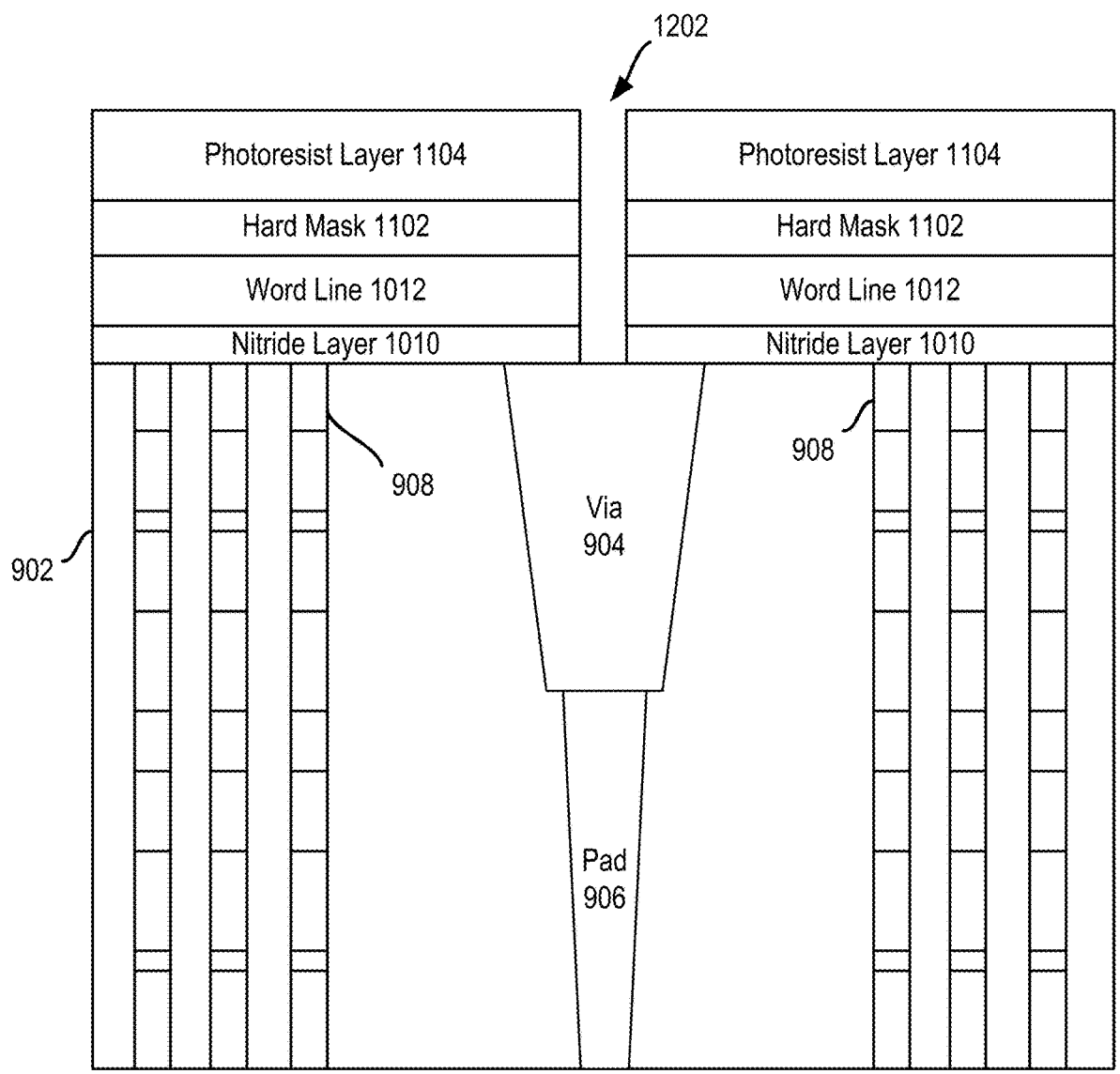

As shown in FIG. 12, photoresist layer 1104 is patterned and used to etch hard mask 1102, word line 1012, and nitride layer 1010 to provide opening 1202 overlying via 904. In one example, a tungsten-only etch is used.

After the above etch, photoresist layer 1104 and hard mask 1102 are removed. Subsequent manufacture of the memory device can be performed using conventional manufacturing techniques.

Providing the opening 1202 splits word line 1012 into left and right portions. In one example, these portions correspond to left and right portions 302, 304.

In one example, the remaining portion of nitride layer 1010 overlying via 904 provides resistive film 318. In an alternative approach, nitride layer 1010 is not etched, so that it fully covers via 904 (e.g., similarly as shown in FIG. 3).

In one embodiment, the memory devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

In one embodiment, a transistor discussed herein (e.g., transistor of transistor circuitry 316) may represent a field-effect transistor (FET) and comprise a three terminal device including a source, drain, and gate. The terminals may be connected to other electronic elements through conductive materials (e.g., metals). In one example, each transistor is used in CMOS transistor circuitry formed at the top surface of a semiconductor wafer and underneath a memory array having multiple decks of memory cells. The source and drain may be conductive and may comprise a heavily-doped (e.g., degenerate) semiconductor region. The source and drain may be separated by a lightly-doped semiconductor region or channel. If the channel is n-type, then the FET may be referred to as a n-type FET. If the channel is p-type, then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be on or activated when a voltage greater than or equal to the transistor's threshold voltage is applied to the transistor gate. The transistor may be off or deactivated when a voltage less than the transistor's threshold voltage is applied to the transistor gate.

Figure 13:
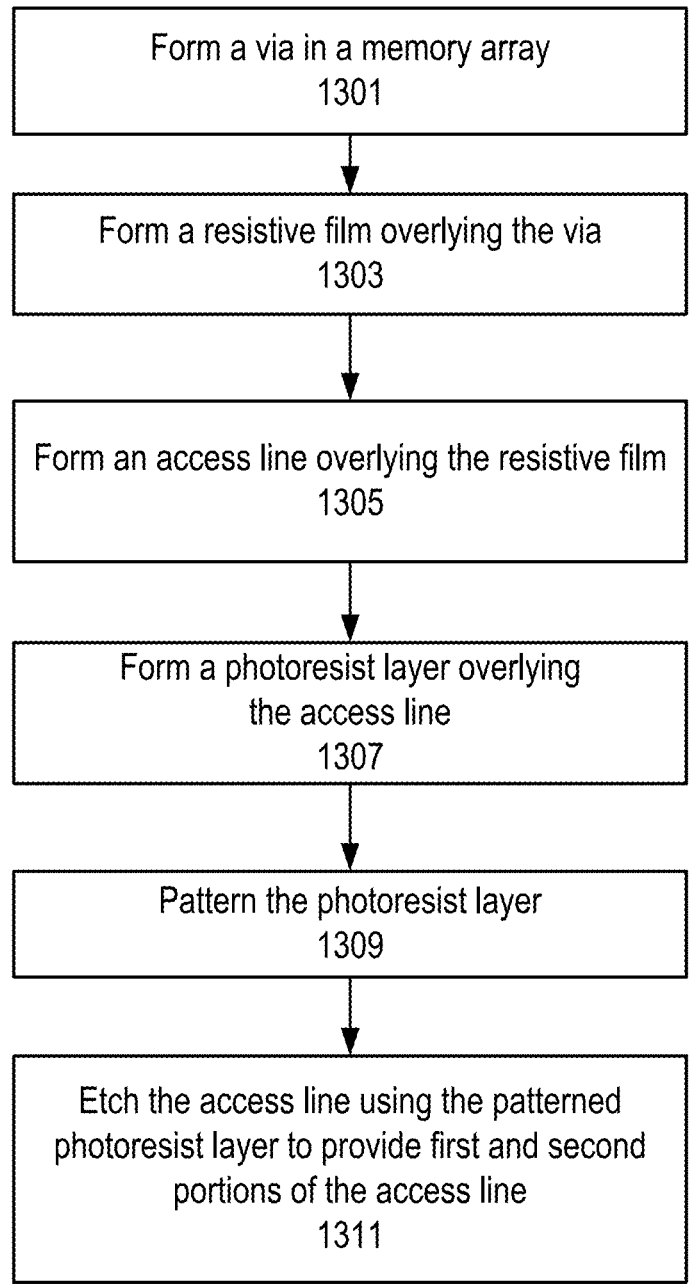
FIG. 13 shows a method for manufacturing a memory device that implements spike current suppression, in accordance with some embodiments.

FIG. 13 shows a method for manufacturing a memory device that implements spike current suppression, in accordance with some embodiments. For example, the method of FIG. 13 can be used to form the split access line and resistive film of FIG. 3. In one example, the manufactured memory device is memory device 101.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1301, a via is formed in a memory array. In one example, the via is via 904. In one example, the memory array is memory array 902.

At block 1303, a resistive film is formed overlying the via. In one example, the resistive film is nitride layer 1010.

At block 1305, an access line is formed overlying the resistive film. In one example, the access line is word line 1012.

At block 1307, a photoresist layer is formed overlying the access line. In one example, the photoresist layer is photoresist layer 1104. In one example, the photoresist layer is formed overlying a hard mask (e.g., hard mask 1102).

At block 1309, the photoresist layer is patterned. In one example, the photoresist layer is patterned to use in etching that provides opening 1202.

At block 1311, the access line is etched using the patterned photoresist layer to provide first and second portions of the access line. In one example, the access line is etched to split the access line into left and right portions 302, 304.

In one embodiment, a method includes: forming a via (e.g., via 312); forming a resistive film (e.g., 318) overlying the via; forming an access line (e.g., an access line that provides left and right portions 302, 304) overlying the resistive film; and patterning the access line to provide first and second portions. The patterning physically separates the first portion from the second portion (e.g., the patterning provides a split in the access line), and the first portion is configured to access a memory cell (e.g., 308) of a memory array. A first section of the resistive film is between the first portion and the via, and a second section of the resistive film is between the second portion and the via.

In one embodiment, patterning the access line includes: forming a photoresist layer overlying the access line; patterning the photoresist layer; and performing an etch using the patterned photoresist layer to etch the access line. Performing the etch includes etching the access line to provide a split overlying the via and between the first and second portions (e.g., a split located in central region 306 and overlying via 312).

In one embodiment, performing the etch further includes etching the resistive film to physically separate the first and second sections.

In one embodiment, the first and second sections of the resistive film each have a thickness of 1 to 20 nanometers; the first section has a width of 10 to 200 nanometers; and the second section has a width of 10 to 200 nanometers.

In one embodiment, the memory array is part of a memory device (e.g., 101). The method further includes forming a transistor circuit (e.g., transistor circuitry 316) located under the memory array and electrically connected to the via. The transistor circuit is configured to generate a voltage on the first portion to access the memory cell during a read or write operation, and the voltage is generated in response to a command received from a host device (e.g., 126) by a controller (e.g., 120) of the memory device.

In some embodiments, spike current suppression is implemented by using a socket structure that is formed in an access line (e.g., formed in one or more word and/or bit lines of a memory array). In some embodiments, a socket of the access line is filled with a conductive layer, and two resistive films are formed in the access line on each side of the conductive layer (see, e.g., FIG. 14). In other embodiments, the socket of the access line is filled with a resistive layer (see, e.g., FIGS. 23-24), and the conductive layer and two resistive films are not used.

In some embodiments, use of the socket structure above in a memory array can be combined with use of the split access line structure as described above (e.g., as described for FIGS. 1-13). In one embodiment, the same access line may use both the split access line structure and the socket structure at various points in the access line. In other embodiments, each type of structure can be used on different access lines.

In one embodiment, a memory device includes a memory array. The memory array includes access lines. Each of one or several access lines can be configured to access memory cells of the memory array, the access line having a first portion and a second portion on opposite sides of the access line. The first portion is configured to access a first memory cell, and the second portion is configured to access a second memory cell. A conductive layer is located between the first portion and the second portion. The conductive layer electrically connects the first portion to the second portion. A first resistor (e.g., a first resistive film integrated into the access line as a spacer) is located between the first portion and the conductive layer. A second resistor (e.g., a second resistive film integrated into the access line as a spacer) is located between the second portion and the conductive layer. One or more vias are located underlying the conductive layer, and electrically connected by the conductive layer to the first and second portions of the access line.

In one embodiment, each of one or more access lines has a first portion and a second portion (e.g., left and right portions of a word line). The first portion is configured to access a first memory cell of a memory array (e.g., on a left side of the array). The second portion is configured to access a second memory cell of the memory array (e.g., on a right side of the array). A conductive layer is located between the first and second portions of the access line and has been formed in a socket of the access line. A first resistive film (e.g., tungsten silicon nitride) is integrated into the access line between the first portion and the conductive layer. A second resistive film (e.g., tungsten silicon nitride) is integrated into the access line between the second portion and the conductive layer. One or more vias are electrically connected through the conductive layer to the first and second portions of the access line.

Figure 14:
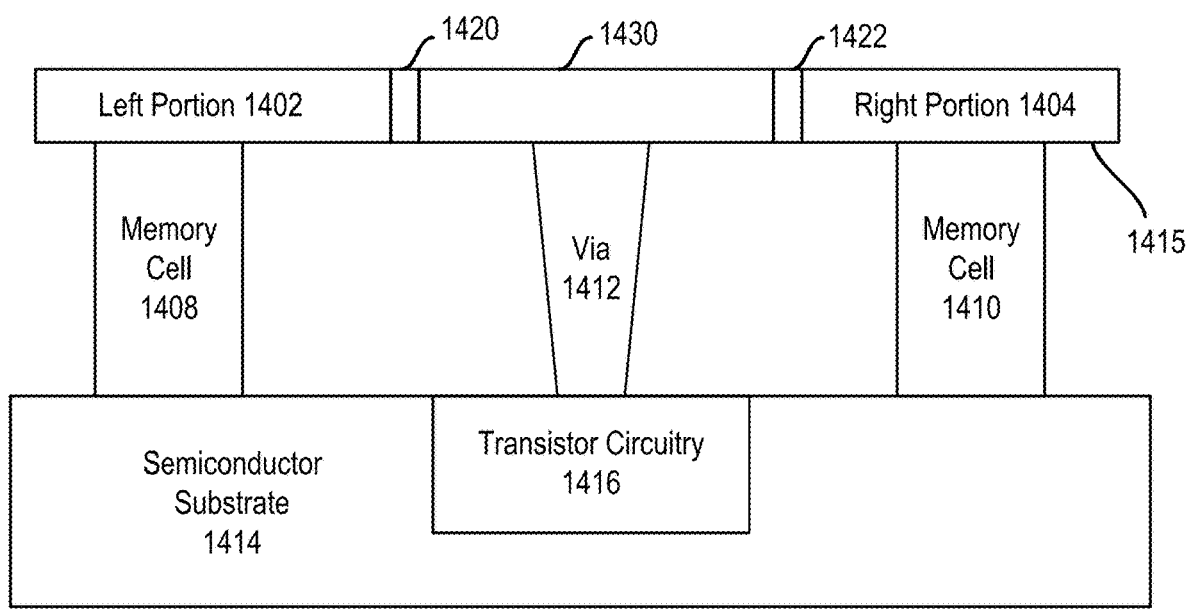
FIG. 14 shows an access line having two resistive films, and a socket in which a conductive layer is formed, for spike current suppression, in accordance with some embodiments.

FIG. 14 shows an access line 1415 having two resistive films 1420, 1422. A conductive layer 1430 has been formed in a socket (see, e.g., socket 1702 of FIG. 17 below) of access line 1415, to implement spike current suppression, in accordance with some embodiments. Access line has a left portion 1402 and a right portion 1404 located on opposite sides of access line 1415. Conductive layer 1430 is located between left and right portions 1402, 1404. Conductive layer 1430 is, for example, tungsten. Resistive film 1420 is located between left portion 1402 and conductive layer 1430. Resistive film 1422 is located between right portion 1404 and conductive layer 1430.

The material used to form resistive films 1420, 1422 has a higher resistivity than the material used to form left and right portions 1402, 1404. In one example, left and right portions 1402, 1404 are formed of tungsten. In one example, resistive films 1420, 1422 are formed of tungsten silicon nitride.

A via 1412 is located underlying conductive layer 1430. Conductive layer 1430 electrically connects via 1412 to left and right portions 1402, 1404. Transistor circuitry 1416 (e.g., a driver) is electrically connected to via 1412. In one embodiment, transistor circuitry 1416 is formed in semiconductor substrate 1414, which is located underlying a memory array including memory cells 1408, 1410.

Left portion 1402 is used to access memory cell 1408. Right portion 1404 is used to access memory cell 1410. Transistor circuitry 1416 generates one or more voltages that are applied to access line 1415 through via 1412. The voltages are applied to access one or more memory cells using access line 1415. In one embodiment, access to the memory cells is accomplished in conjunction with applying one or more voltages to bit lines (not shown) of the memory array.

In one example, memory cells 1408, 1410 are similar to memory cells 110, 112, memory cells 206, 208, memory cells 402, 404, or memory cell 401. In one example, each access line 1415 is one of access lines 130. In one example, transistor circuitry 1416 is similar to transistor circuitry 316.

In one embodiment, additional resistive films can be integrated into access line 1415. In one embodiment, access line 1415 has an additional portion (not shown) electrically connected to left portion 1402 by an additional resistive film (not shown). For example, the additional portion and the additional resistive film are located to the left of memory cell 1408. In one example, each side of access line 1415 on opposite sides of via 1412 can have multiple portions separated by multiple resistive films (not shown).

In other embodiments, a signal line (not shown) of a memory or other semiconductor device can have multiple portions (e.g., tungsten portions) separated by multiple resistive films (e.g., WSiN) such as the resistive films described above.

In one embodiment, the thickness of resistive films 1420, 1422 can be varied to control the magnitude of the resistance. In one embodiment, each resistive film 1420, 1422 has a different thickness. In one example, the thickness is selected to correspond to a characteristic of the respective portion of the access line 1415, and/or a respective characteristic of a particular region of the memory array, and/or a respective characteristic of memory cells accessed by the portion of the access line.

In one embodiment, an apparatus includes: a memory array including an access line (e.g., 1415, 1612) configured to access memory cells (e.g., 1408, 1410) of the memory array, the access line having a first portion (e.g., left portion 1402) and a second portion (e.g., right portion 1404) on opposite sides of the access line, where the first portion is configured to access a first memory cell, and the second portion is configured to access a second memory cell; a conductive layer (e.g., 1430) between the first portion and the second portion, where the conductive layer electrically connects the first portion to the second portion; a first resistor (e.g., 1420) between the first portion and the conductive layer; a second resistor (e.g., 1422) between the second portion and the conductive layer; and at least one via (e.g., 1412) underlying the conductive layer, and electrically connected by the conductive layer to the first portion and the second portion.

In one embodiment, the apparatus further includes a driver (e.g., a driver of transistor circuitry 1416) electrically connected to the via, where the driver is configured to generate a voltage on the first portion to access the first memory cell, and to generate a voltage on the second portion to access the second memory cell.

In one embodiment, the at least one via is a single via; the access line is a bit line or a word line; and the driver is a bit line driver or a word line driver.

In one embodiment, the first resistor is a first resistive layer on an end of the first portion; and the second resistor is a second resistive layer on an end of the second portion. The conductive layer is formed in a socket (e.g., 1702) of the access line. The socket is overlying the via and between the first and second portions of the access line.

In one embodiment, each of the first resistive layer and the second resistive layer includes tungsten silicon nitride.

In one embodiment, the socket is formed by patterning and removing a third portion of the access line to physically separate the first portion from the second portion; and prior to removing the third portion, the third portion is located between the first portion and the second portion.

In one embodiment, the memory array is part of a memory device; the access line is associated with a physical address within the memory array; and an access operation by a controller of the memory device to select the first memory cell addresses both the first and second portions of the access line.

In one embodiment, an apparatus includes: an access line having a first portion and a second portion, where the first portion is configured to access a memory cell of a memory array; a conductive layer between the first portion and the second portion; a first resistive film (e.g., 1420, 1902) between the first portion and the conductive layer; a second resistive film (e.g., 1422, 1904) between the second portion and the conductive layer; and a via electrically connected, by the conductive layer, to the first portion and the second portion.

In one embodiment, the apparatus further includes a driver electrically connected to the via, where the driver is configured to generate a voltage on the first portion to access the memory cell.

In one embodiment, the conductive layer is located in a socket between the first portion and the second portion; and the socket is formed by removing a third portion of the access line to physically separate the first portion of the access line from the second portion.

In one embodiment, a material forming each of the first resistive film and the second resistive film has a higher resistivity than a material forming the first and second portions of the access line.

In one embodiment, each of the first and second resistive films includes at least one of: tungsten silicon nitride; titanium silicide nitride; tungsten nitride; titanium nitride; tungsten silicide; or cobalt silicide.

In one embodiment, each of the first and second portions is configured to access memory cells located above and below the respective portion.

In one embodiment, the memory array has a cross-point architecture, and the memory cell is: a memory cell including chalcogenide; a memory cell including a select device, and a phase change material as a memory element; a self-selecting memory cell including chalcogenide; or a resistive memory cell.

In one embodiment, the apparatus further includes a driver connected to the via, where: the access line further has a third portion located at an end of the access line, and overlying or underlying the memory cell; the apparatus further includes a third resistive film between the first portion and the third portion; and the third portion is electrically connected to the via by the first portion so that the driver can generate a voltage on the third portion for accessing the memory cell.

FIGS. 15-21 show steps in the manufacture of a memory device that implements spike current suppression by forming two resistive films in an access line, and a conductive layer in a socket of the access line, in accordance with some embodiments. In one example, the memory device is memory device 101.

Figure 15:
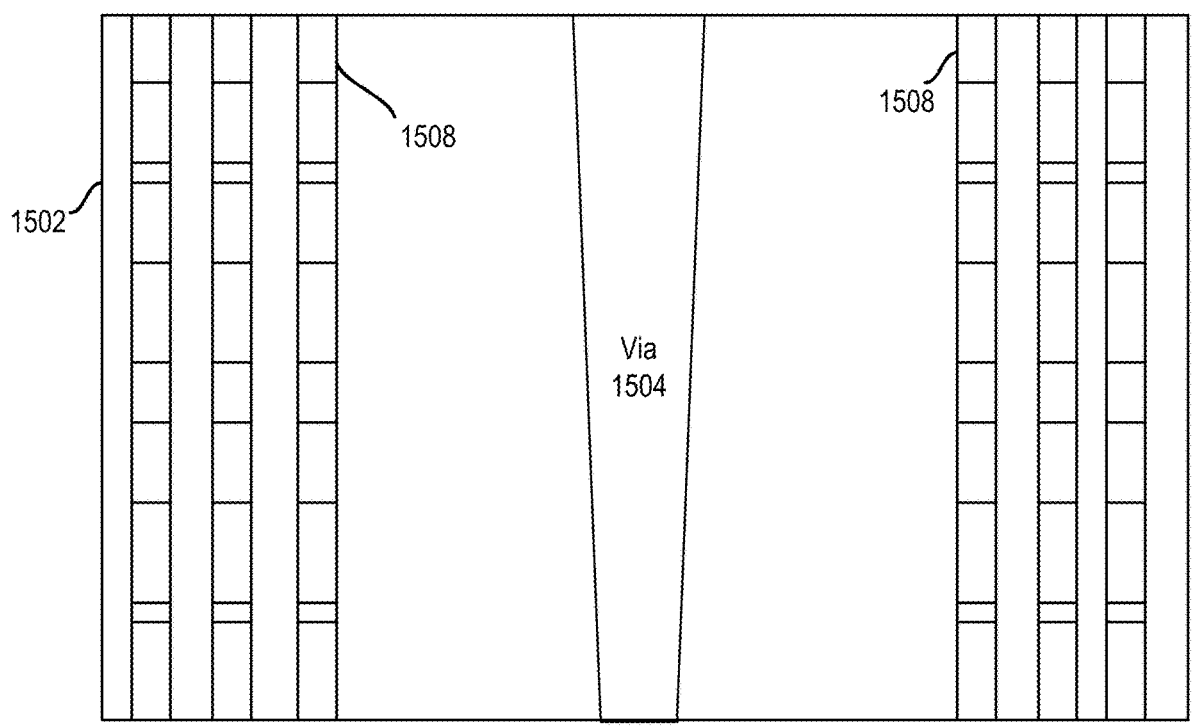
FIGS. 15-21 show steps in the manufacture of a memory device that implements spike current suppression by forming two resistive films in an access line, and a conductive layer in a socket of the access line, in accordance with some embodiments.

FIG. 15 shows a memory array 1502 at an intermediate stage of manufacture. Memory array 1502 includes various memory cells 1508. Each memory cell 1508 includes a memory stack containing various layers of materials (e.g., chalcogenide, phase change material, etc.) corresponding to the memory cell technology that has been chosen for use (see, e.g., FIG. 8). Memory cells 1508 are an example of memory cells 110, 112; memory cells 206, 208; or memory cells 1408, 1410.

Memory array 1502 includes a via 1504. In some cases, via 1504 can be formed on a pad similar to pad 906. Memory array 1502 as shown in FIG. 15 can be formed using conventional manufacturing techniques.

Figure 16:
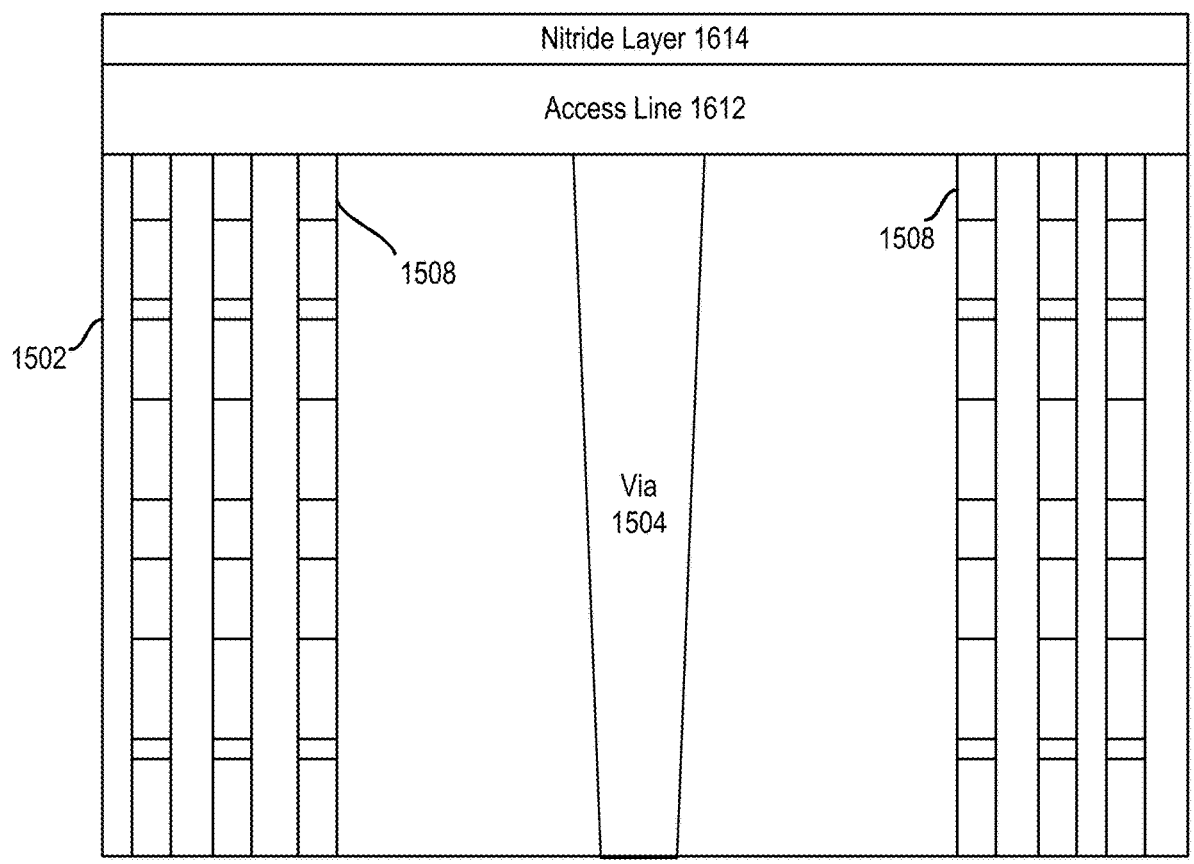

As shown in FIG. 16, an access line 1612 (e.g., a word line or bit line) is formed overlying a top surface of memory array 1502. In one example, access line 1612 is tungsten. Other conductive materials may be used.

An optional nitride layer 1614 is formed overlying access line 1612. Nitride layer 1614 is, for example, a silicon nitride layer. In one embodiment, nitride layer 1614 is later used as an etch stop. A photoresist layer (not shown) is formed overlying nitride layer 1614 to use for patterning both nitride layer 1614 and access line 1612.

Figure 17:
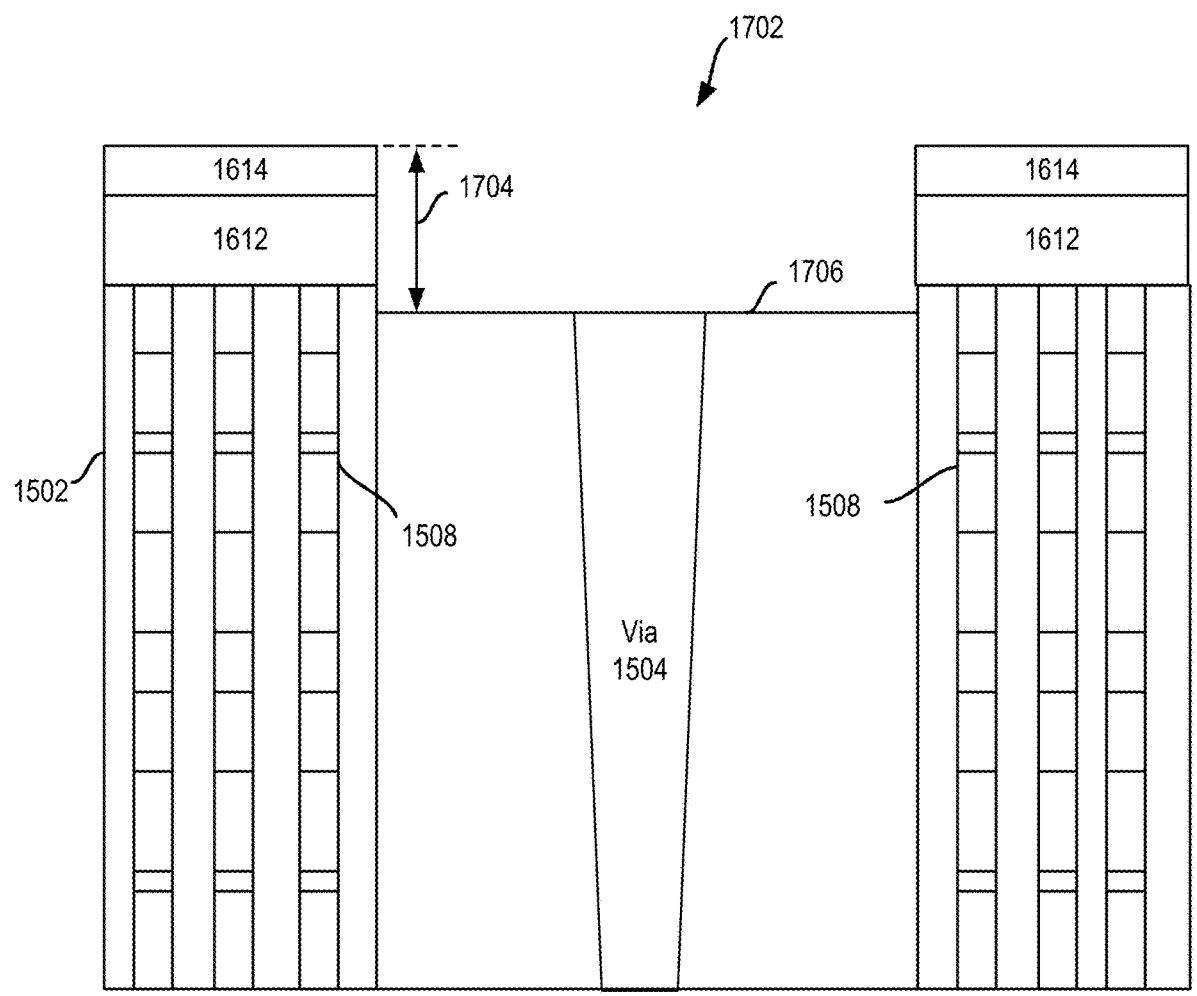

As shown in FIG. 17, nitride layer 1614 and access line 1612 have been patterned by, for example, etching using the photoresist layer above. This patterning provides a socket 1702 in access line 1612. Socket 1702 has a height 1704 measured from a bottom 1706 of socket 1702 to a top surface of nitride layer 1614. If nitride layer 1614 is not used, height 1704 is measured to a top surface of access line 1612. In various embodiments, socket 1702 can be filled with a conductive and/or resistive material that electrically connects the left and right portions of access line 1612. In various embodiments, socket 1702 physically separates the left and right portions of access line 1612.

Figure 18:
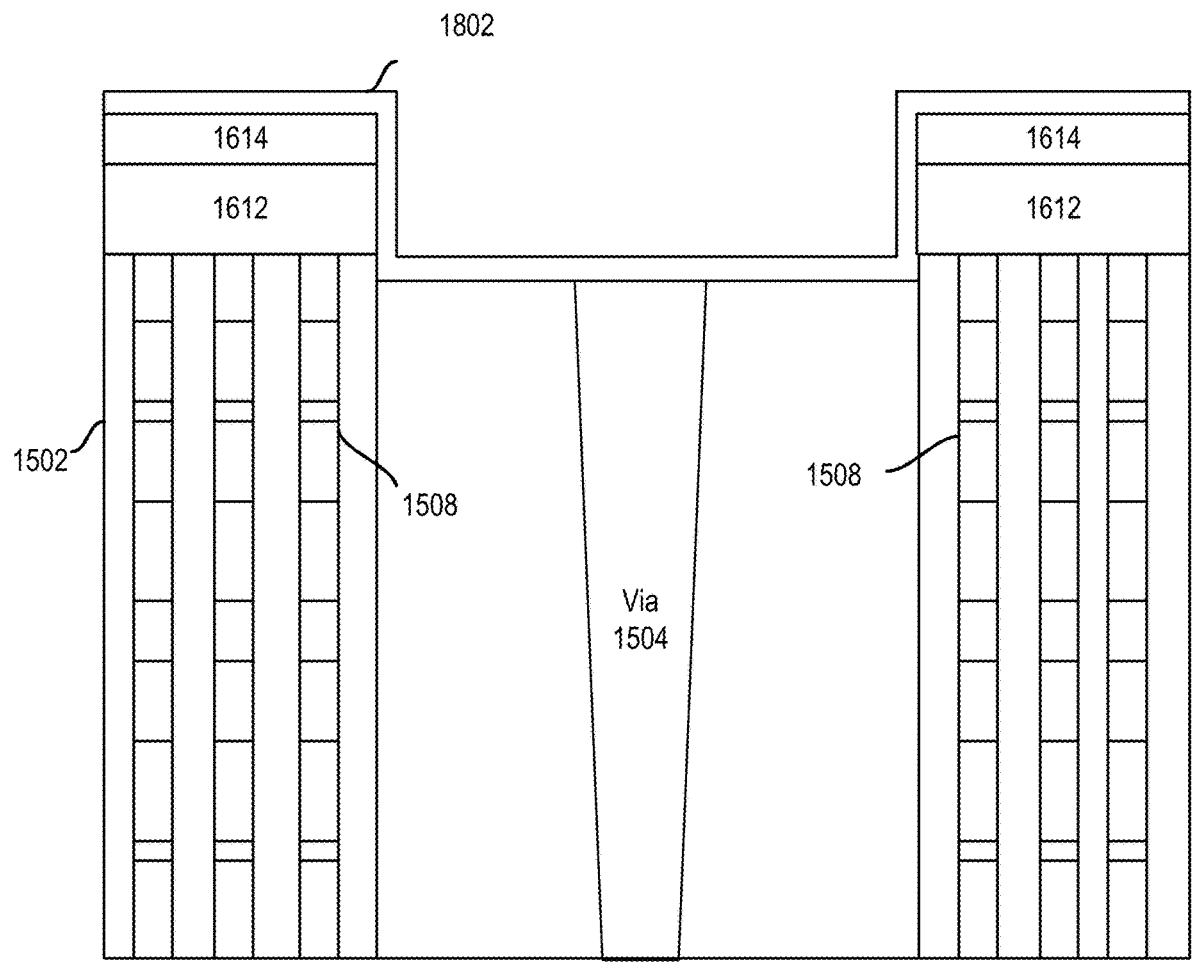

As shown in FIG. 18, resistive layer 1802 is formed overlying the left and right portions of nitride layer 1614, the left and right portions of access line 1612, and filling part of the bottom of socket 1702. In one example, resistive layer 1802 includes one or more of tungsten silicon nitride, titanium silicide nitride, tungsten nitride, or titanium nitride. In one example, one or more of tungsten silicide or cobalt silicide can be alternatively or additionally used. The proportions of the foregoing materials can be varied for different memory arrays. In one example, resistive layer 1802 is formed using a conformal deposition process (e.g., for forming sidewall spacers from resistive layer 1802).

Figure 19:
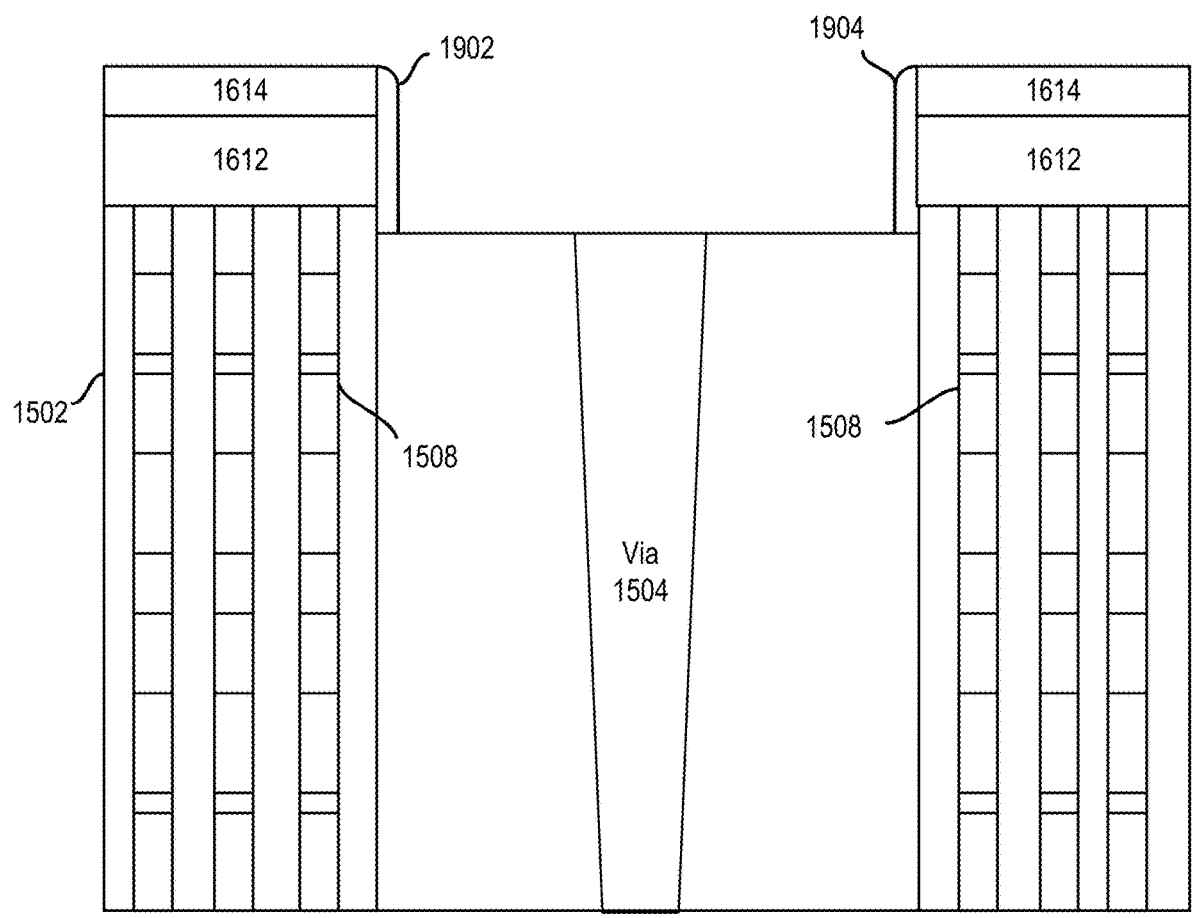

As shown in FIG. 19, resistive layer 1802 has been etched to provide resistive films 1902, 1904 as spacers on sidewalls of the left and right portions of access line 1612 and nitride layer 1614. In one example, each spacer has a thickness of 1 to 60 nanometers.

Figure 20:
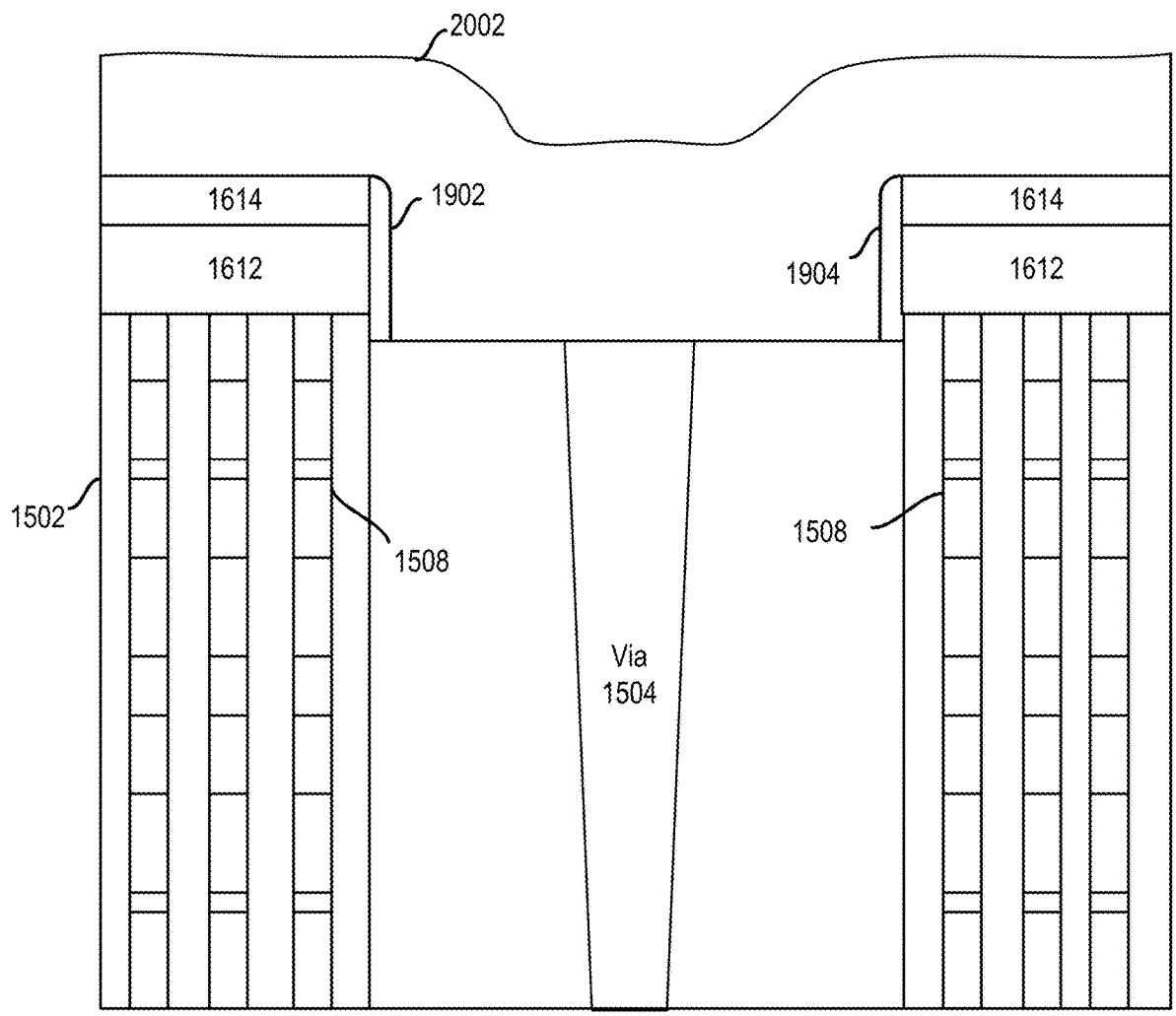

As shown in FIG. 20, a conductive layer 2002 is formed. A portion of conductive layer 2002 is formed in socket 1702. In one embodiment, conductive layer 2002 is formed of the same material as access line 1612. In one example, conductive layer 2002 is tungsten. In one example, conductive layer 2002 is formed by chemical vapor deposition. In one embodiment, conductive layer 2002 is formed of a different material than access line 1612.

Figure 21:
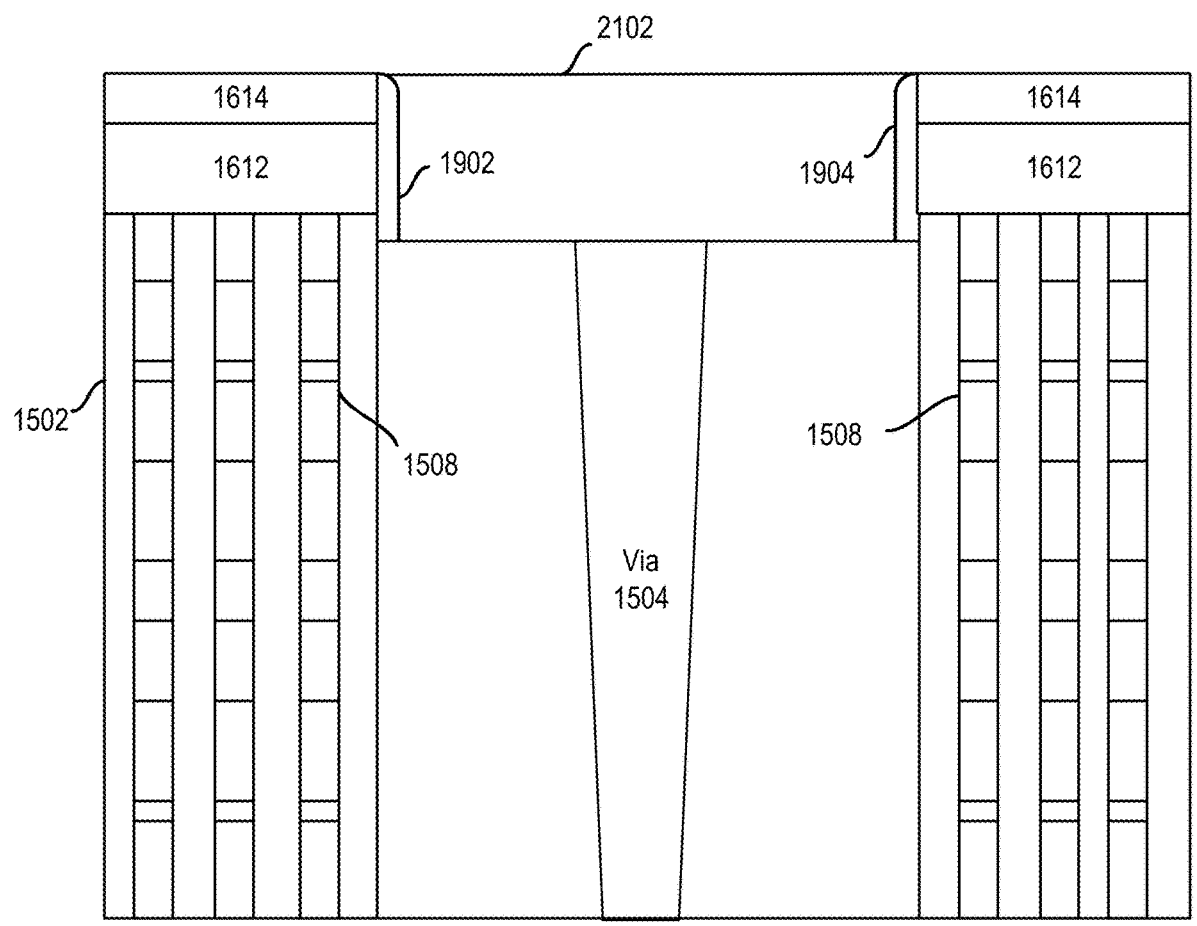

As shown in FIG. 21, the uppermost part of conductive layer 2002 is removed by performing chemical mechanical polishing (CMP) using silicon nitride layer 1614 as a stop layer. After performing the CMP, conductive portion 2102 remains in socket 1702 (e.g., completely filling the socket, or filling the socket by at least 85 percent by volume).

Subsequent manufacture of the memory device can be performed using conventional manufacturing techniques.

As mentioned above, access line 1612 is separated into left and right portions. In one example, these portions correspond to left and right portions 1402, 1404 of FIG. 14. Conductive portion 2102 electrically connects each of the left and right portions of access line 1612 to via 1504 (through resistive films 1902, 1904, which are electrically in series).

In one embodiment, the memory array of FIG. 15 may be formed on a semiconductor substrate (e.g., substrate 1414 of FIG. 14), such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

In one embodiment, a transistor as used herein (e.g., a transistor of transistor circuitry 1416 of FIG. 14) may represent a field-effect transistor (FET) and comprise a three terminal device including a source, drain, and gate. The terminals may be connected to other electronic elements through conductive materials (e.g., metals). In one example, each transistor is used in CMOS transistor circuitry formed at the top surface of a semiconductor wafer and underneath a memory array having multiple decks of memory cells.

Figure 22:
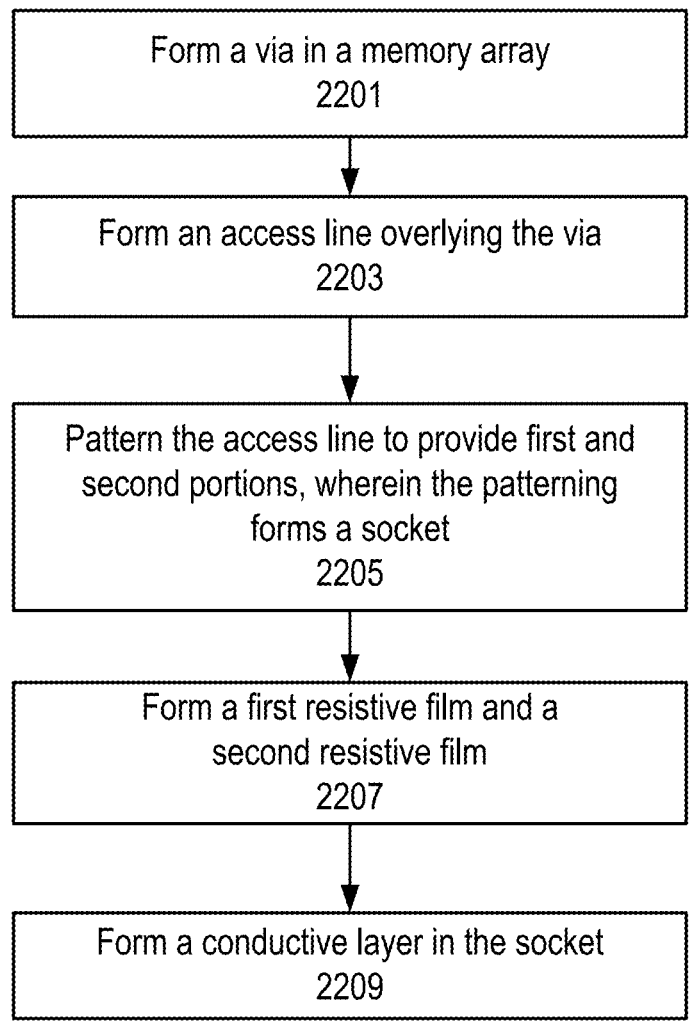
FIG. 22 shows a method for manufacturing a memory device that implements spike current suppression by forming two resistive films and a conductive layer in a socket, in accordance with some embodiments.

FIG. 22 shows a method for manufacturing a memory device that implements spike current suppression by forming two resistive films and a conductive layer in a socket, in accordance with some embodiments. For example, the method of FIG. 22 can be used to form socket 1702 of FIG. 17 and resistive films 1902, 1904 of FIG. 21. In one example, the manufactured memory device is memory device 101.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 2201, a via is formed in a memory array. In one example, the via is via 1412 or 1504. In one example, the memory array is memory array 1502.

At block 2203, an access line is formed overlying the via. In one example, the access line is access line 1612.

At block 2205, the access line is patterned to provide first and second portions. The patterning forms a socket. In one example, the socket is socket 1702. In one example, the first and second portions are the left and right portions of access line 1612.

At block 2207, a first resistive film and a second resistive film are formed. In one example, the first and second resistive films are spacers 1902, 1904.

At block 2209, a conductive layer is formed in the socket. In one example, the conductive layer is conductive layer 2002.

In one embodiment, a method includes: forming a via (e.g., 1504); forming an access line (e.g., 1612) overlying the via; patterning the access line to provide first and second portions of the access line. The patterning forms a socket (e.g., 1702) that physically separates the first portion and the second portion. The first portion is configured to access a memory cell (e.g., 1508) of a memory array. The method further includes: forming a first resistive film (e.g., 1902) on a sidewall of the first portion, and a second resistive film (e.g., 1904) on a sidewall of the second portion; and forming a conductive layer (e.g., 2002) in the socket. The conductive layer electrically connects each of the first and second portions of the access line to the via.

In one embodiment, patterning the access line includes: forming a photoresist layer overlying the access line; patterning the photoresist layer; and performing an etch using the patterned photoresist layer to etch the access line, where performing the etch includes etching the access line to provide the socket.

In one embodiment, each of the first and second resistive films has a thickness of 1 to 60 nanometers.

In one embodiment, the memory array is part of a memory device. The method further includes forming a transistor circuit located under the memory array, where the transistor circuit is configured to generate, using an electrical connection to the via, a voltage on the first portion to access the memory cell during a read or write operation, and the voltage is generated in response to a command received from a host device by a controller of the memory device.

In one embodiment, the method further includes, prior to patterning the access line, forming a silicon nitride layer (e.g., 1614) overlying the access line. Patterning the access line to form the socket includes etching a portion of the silicon nitride layer and the access line.

In one embodiment, the method further includes: after forming the conductive layer in the socket, performing chemical mechanical polishing of the conductive layer using the silicon nitride layer as a stop layer.

In one embodiment, the conductive layer is formed by chemical vapor deposition.

In one embodiment, forming the first and second resistive films is performed by: forming a resistive layer (e.g., 1802) overlying the first and second portions of the access line, and overlying a bottom of the socket; and etching the resistive layer (see, e.g., FIG. 19) to provide the first and second resistive films as spacers on the respective sidewalls of the first and second portions of the access line.

Figure 23:
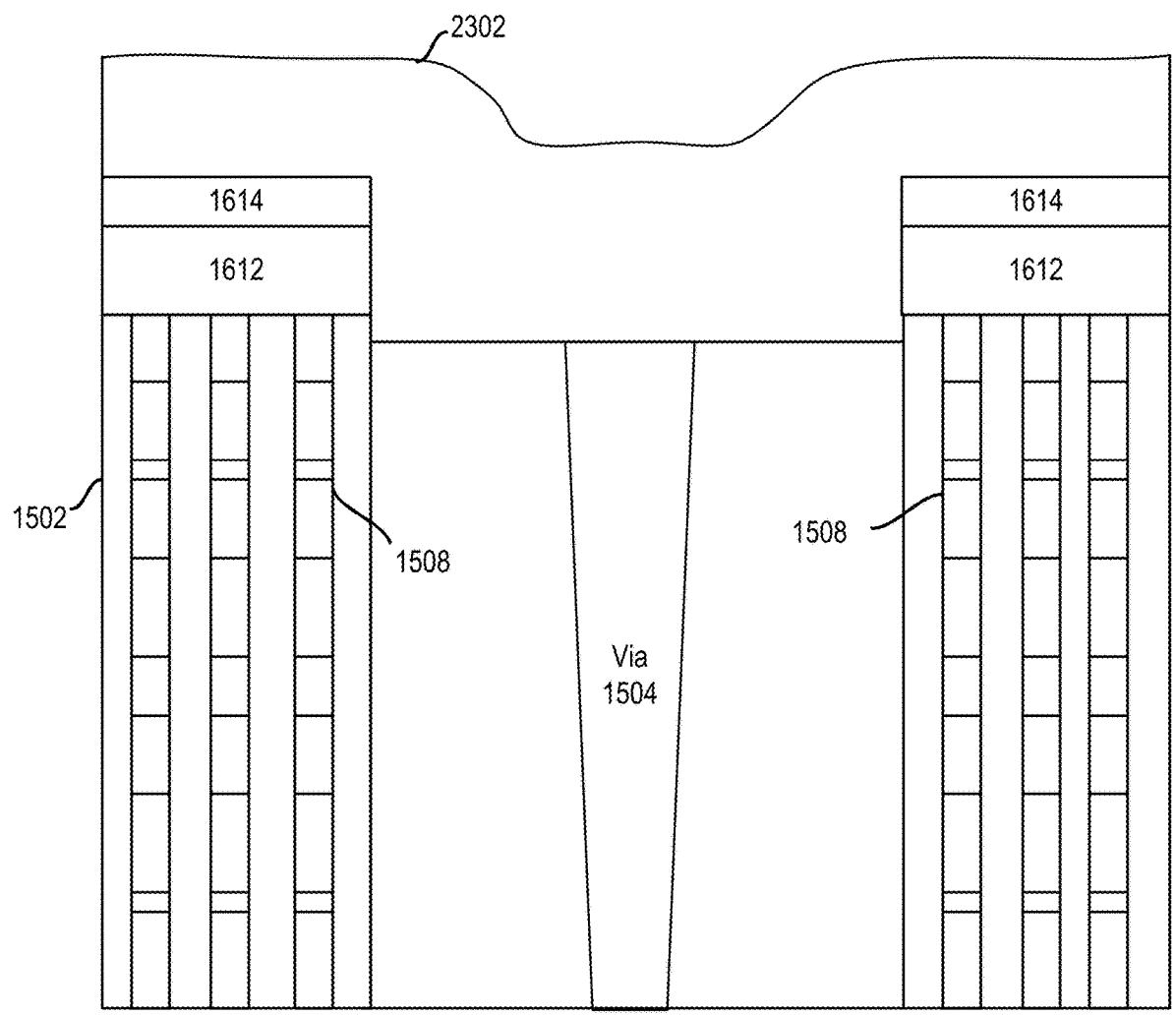
FIGS. 23 and 24 show steps in the manufacture of a memory device that implements spike current suppression by forming a resistive layer in a socket, in accordance with some embodiments.
Figure 24:
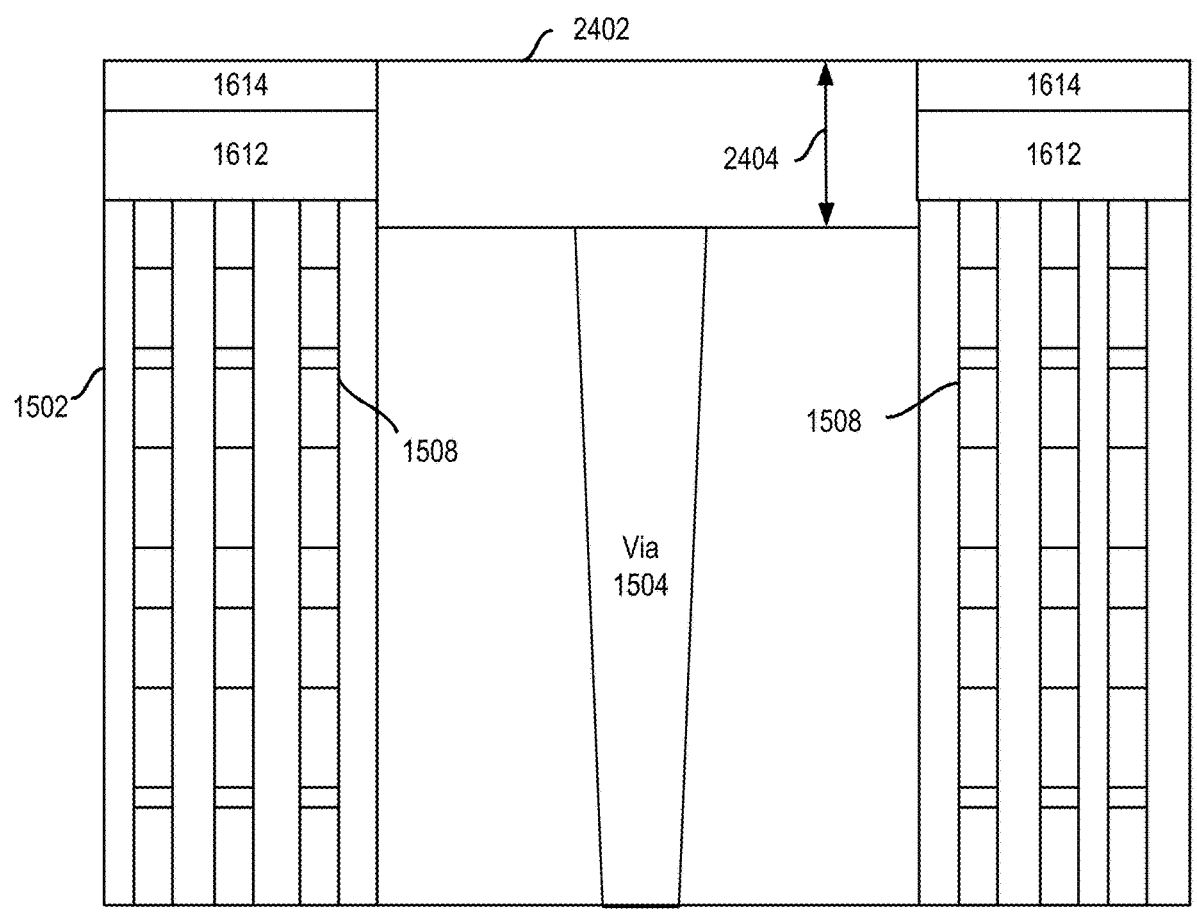

FIGS. 23 and 24 show steps in the manufacture of a memory device that implements spike current suppression by forming a resistive layer in a socket, in accordance with some embodiments. In one example, the memory device is memory device 101.

FIG. 23 shows memory array 1502 at an intermediate stage of manufacture. In one embodiment, memory array 1502 as shown in FIG. 23 can be formed similarly as described for FIGS. 15-17 above.

As shown in FIG. 23, a resistive layer 2302 is formed in socket 1702. Resistive layer 2302 is used to electrically connect each of left and right portions of access line 1612 to via 1504 in the final memory device. In one example, resistive layer 2302 includes one or more of tungsten silicon nitride, titanium silicide nitride, tungsten nitride, or titanium nitride. In one example, one or more of tungsten silicide or cobalt silicide can be alternatively or additionally used. The proportions of the foregoing materials can be varied for different memory arrays.

As shown in FIG. 24, chemical mechanical polishing of resistive material 2302 is performed so that resistive portion 2402 remains in socket 1702. Resistive portion 2402 fills socket 1702 to a height 2404. In one embodiment, after the chemical mechanical polishing, resistive portion 2402 fills at least 50 percent of the volume of socket 1702, where the volume is determined by height 2404 multiplied by an area of the bottom surface 1706 of socket 1702 (such as shown in FIG. 17).

Figure 25:
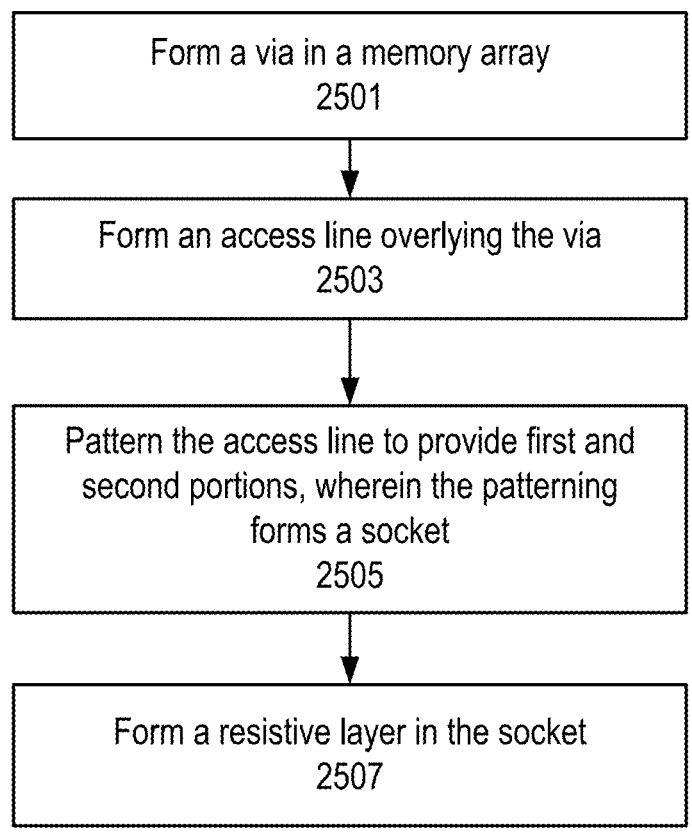
FIG. 25 shows a method for manufacturing a memory device that implements spike current suppression by forming a resistive layer in a socket, in accordance with some embodiments.

FIG. 25 shows a method for manufacturing a memory device that implements spike current suppression by forming a resistive layer in a socket, in accordance with some embodiments. For example, the method of FIG. 25 can be used to form resistive layer 2302 of FIG. 23. In one example, the manufactured memory device is memory device 101.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 2501, a via is formed in a memory array. In one example, the via is via 1504. In one example, the memory array is memory array 1502.

At block 2503, an access line is formed overlying the via. In one example, the access line is access line 1612.

At block 2505, the access line is patterned to provide first and second portions. The patterning forms a socket. In one example, the socket is socket 1702.

At block 2507, a resistive layer is formed in the socket. In one example, the resistive layer is resistive layer 2302.

In one embodiment, a method includes: forming a via; forming an access line overlying the via; patterning the access line to provide first and second portions of the access line, where the patterning forms a socket that physically separates the first portion and the second portion, and where the first portion is configured to access a memory cell of a memory array; and forming a resistive layer (e.g., 2302 of FIG. 23) in the socket, where the resistive layer electrically connects each of the first and second portions of the access line to the via.

In one embodiment, the resistive layer includes at least one of: tungsten silicon nitride; titanium silicide nitride; tungsten nitride; titanium nitride; tungsten silicide; or cobalt silicide.

In one embodiment, patterning the access line includes: forming a photoresist layer overlying the access line; patterning the photoresist layer; and performing an etch using the patterned photoresist layer to etch the access line, where performing the etch includes etching the access line to provide the socket.

In one embodiment, the method further includes forming a driver underlying the memory array, where the driver is electrically connected to the via and configured to generate a voltage on the first portion of the access line for accessing the memory cell during a read or write operation.

In one embodiment, the method further includes: after forming the resistive layer in the socket, performing chemical mechanical polishing of the resistive layer. After the chemical mechanical polishing, the resistive layer fills at least 50 percent of a volume of the socket.

In some embodiments, spike current suppression is implemented by one or more charge screening structures that are formed into one or more access lines of a memory array. Each charge screening structure includes an insulating layer that splits the access line into top and bottom portions, each electrically isolated from the other by the insulating layer (e.g., a thin insulator located in the middle of the access line). This increases the electrical resistance to memory cells of the memory array that are located above and/or below one of the insulating layers. For example, the increased resistance forms a resistive bottleneck that chokes charge flowing from parasitic capacitances of the memory array that might otherwise damage a memory cell that has been selected. In one example, the insulating layer is an oxide.

In some embodiments, the use of one or more charge screening structures having insulating layers in the access line as described herein can be combined with use of the split access line structure as described above (e.g., as described for FIGS. 1-13), and/or use of the socket structure as described above (e.g., as described for FIGS. 14-25). In one embodiment, the same access line may use charge screening structures, the split access line structure, and/or the socket structure at various points in the access line. In other embodiments, each type of structure can be used on different access lines.

In one embodiment, a memory device includes a memory array. The memory array includes access lines. Each of one or several access lines can be configured to access memory cells of the memory array, the access line having a first portion and a second portion on opposite sides (e.g., left and right sides) of the access line. The first portion is configured to access a first memory cell, and the second portion is configured to access a second memory cell. Each of the first and second portions includes one or more charge screening structures.

In one embodiment, the charge screening structures are implemented as various screening portions located along the access line. A first screening portion of the access line is located in an electrical path between the far memory cells accessed by the first portion and the via(s). The first screening portion has a first insulating layer in an interior region (e.g., an oxide layer in the middle) of the access line (e.g., on a left side of the array). A second screening portion of the access line is located in an electrical path between the far memory cells accessed by the second portion and the via(s). The second screening portion has a second insulating layer in an interior region of the access line (e.g., on a right side of the array). Each screening portion increases a resistance of an electrical path to the near memory cells located above or below one of the insulating layers, so that spike current is suppressed.

Figure 26:
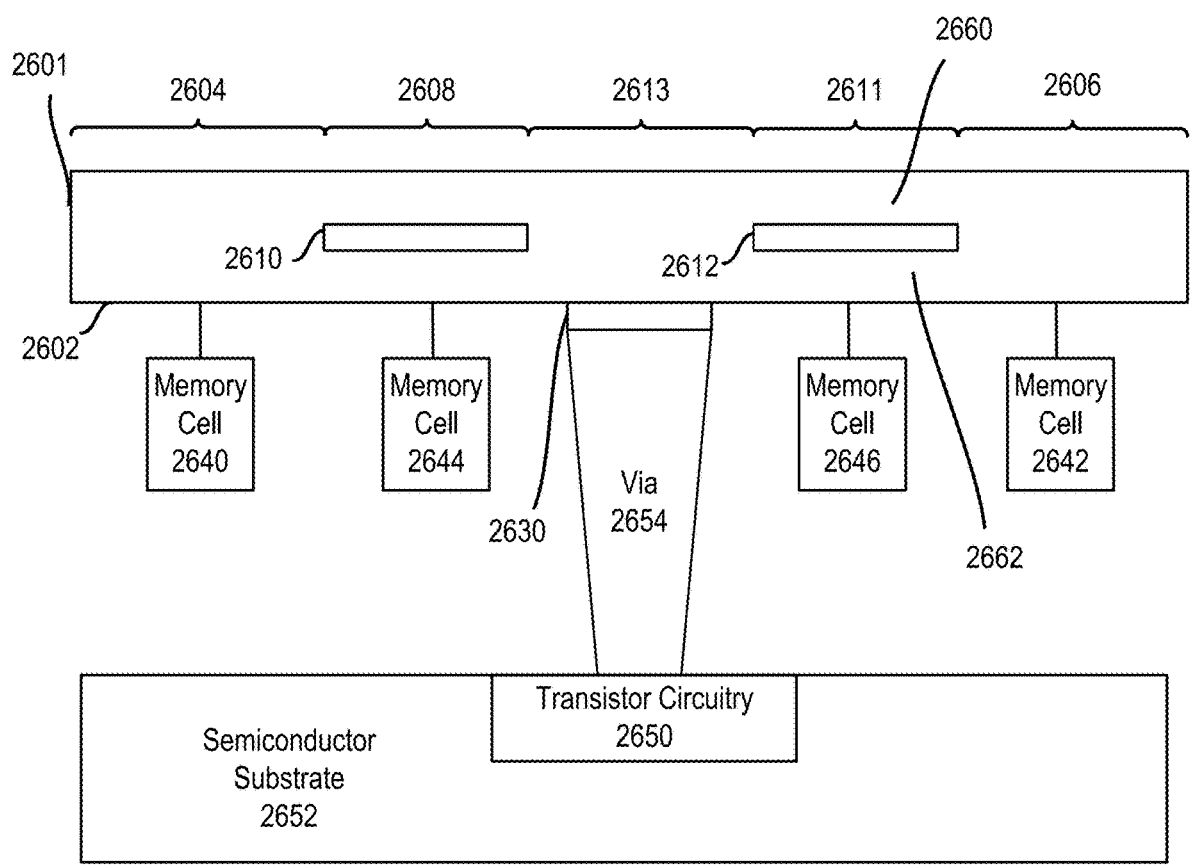
FIG. 26 shows an access line having charge screening structures that are used for spike current suppression, in accordance with some embodiments.

FIG. 26 shows an access line 2602 having charge screening structures that are used for spike current suppression, in accordance with some embodiments. The charge screening structures include screening portions 2608, 2611. Each screening portion 2608, 2611 has a respective insulating layer 2610, 2612 that splits the access line 2602 into an upper or top portion (e.g., 2660) and a lower or bottom portion (e.g., 2662). The upper portion in effect provides an upper resistor, and the lower portion in effect provides a lower resistor. The upper and lower resistors increase the resistance of the electrical path used to access near memory cells above and below the insulating layer 2610, 2612. For example, the resistance of each upper and lower resistor as used to access one of these near memory cells is greater than a resistance of a comparable length of the conductive portion of access line 2602 used to access far memory cells that are not located overlying or underlying an insulating layer.

Other portions of access line 2602 include conductive portions 2604, 2606 on opposite sides of access line 2602. Conductive portion 2604 is, for example, located near distal end 2601 of access line 2602.

Access line 2602 is used to access various memory cells within a memory array. In one example, the memory array is memory array 102 of FIG. 1. These memory cells include, for example, memory cells 2640, 2642, 2644, 2646. Near memory cells 2644, 2646 are located underlying insulating layers 2610, 2612. Far memory cells 2640, 2642 are located in portions of access line 2602 that do not contain any such insulating layer. Although not shown, other memory cells can be located overlying insulating layers 2610, 2612 (e.g., in a deck of the memory array above access line 2602).

Access line 2602 includes a central conductive portion 2613. Via 2654 is located underlying central conductive portion 2613, which electrically connects via 2654 to screening portions 2608, 2611 and conductive portions 2604, 2606. An optional resistive layer 2630 is located between via 2654 and access line 2602. In one example, resistive layer 2630 is formed of tungsten silicon nitride (WSiN).

Via 2654 is electrically connected to transistor circuitry 2650. Transistor circuitry 2650 includes one or more drivers used to generate voltages on access line 2602 for accessing various memory cells. Transistor circuitry 2650 is formed at a surface of semiconductor substrate 2652. In one example, transistor circuitry 2650 is implemented using bias circuitry 124 of FIG. 1. In one example, semiconductor substrate 2652 is similar to semiconductor substrate 314 of FIG. 3.

In one embodiment, an apparatus includes: a memory array including memory cells (e.g., 2640, 2642, 2644, 2646); an access line (e.g., 2602) configured to access the memory cells, the access line having a first conductive portion (e.g., 2604) and a second conductive portion (e.g., 2606) on opposite sides of the access line; at least one via electrically connected to the first conductive portion and the second conductive portion; a first screening portion (e.g., 2608) of the access line, the first screening portion located in an electrical path between the first conductive portion and the via, and the first screening portion including a first insulating layer (e.g., 2610) in an interior region of the access line; and a second screening portion (e.g., 2611) of the access line, the second screening portion located in an electrical path between the second conductive portion and the via, and the second screening portion including a second insulating layer (e.g., 2612) in an interior region of the access line.

In one embodiment, the first screening portion further includes a first upper resistor above the first insulating layer, and a first lower resistor below the first insulating layer; and the second screening portion further includes a second upper resistor (e.g., 2660) above the second insulating layer, and a second lower resistor (e.g., 2662) below the second insulating layer.

In one embodiment, the access line is formed by placing a top conductive layer overlying a bottom conductive layer; the first upper resistor is a portion of the top conductive layer overlying the first insulating layer; and the first lower resistor is a portion of the bottom conductive layer underlying the first insulating layer.

In one embodiment, a first memory cell accessed by the access line is located underlying or overlying the first insulating layer, and a second memory cell accessed by the access line is located underlying or overlying the second insulating layer.

In one embodiment, the apparatus further includes a central conductive portion (e.g., 2613) of the access line located between the first conductive portion and the second conductive portion. The via is located underlying the central conductive portion; and the first insulating layer and the second insulating layer do not extend into the central conductive portion.

In one embodiment, the apparatus further includes a resistive layer (e.g., 2630) between the via and the central conductive portion.

In one embodiment, the resistive layer includes tungsten silicon nitride.

In one embodiment, each of the first insulating layer and the second insulating layer has a thickness of 1 to 15 nanometers.

In one embodiment, the at least one via is a single via; and the access line is a bit line.

In one embodiment, the memory array is part of a memory device; and an access operation by a controller of the memory device to select the first memory cell addresses both the first and second conductive portions of the access line.

Figure 27:
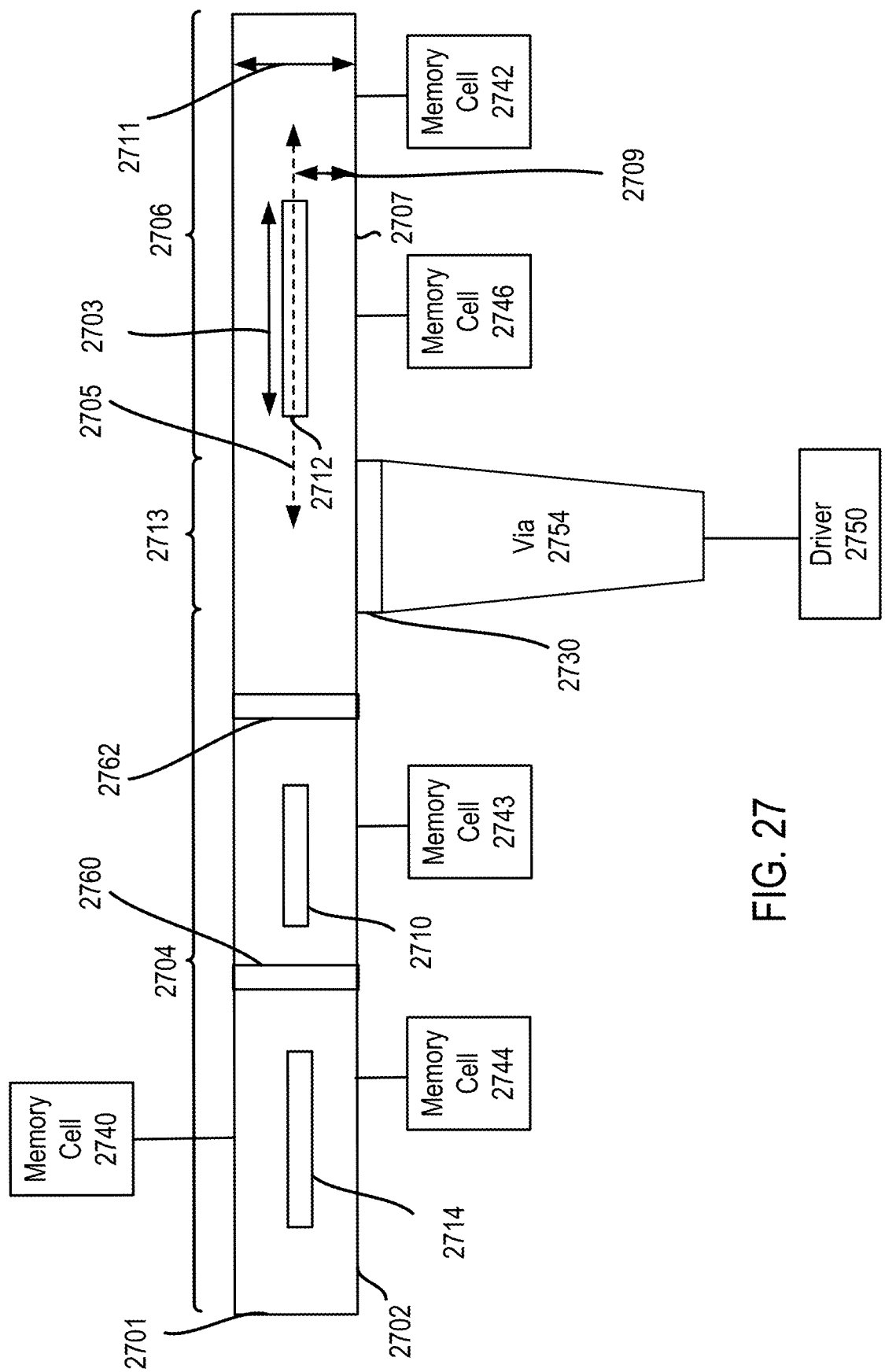
FIG. 27 shows an access line having insulating layers located in interior regions of the access line and used for spike current suppression, in accordance with some embodiments.

FIG. 27 shows an access line 2702 having insulating layers 2710, 2712, 2714 located in interior regions of access line 2702 and used for spike current suppression, in accordance with some embodiments. In one example, access line 2702 is similar to access line 2602. Access line 2702 includes left portion 2704, right portion 2706, and central portion 2713. Left portion 2704 and right portion 2706 are on opposite sides of central portion 2713.

Insulating layers 2710, 2714 are located in interior regions of the left portion 2704 of access line 2702. Insulating layer 2712 is located in an interior region of the right portion 2706 of access line 2702. Insulating layer 2714 is spaced apart from insulating layer 2710 and located towards distal end 2701 of access line 2702.

In one example, insulating layer 2710 is located in the middle of access line 2702 (e.g., at a height equal to 40-60 percent of the thickness 2711 of access line 2702). In other examples, insulating layer 2710 can be located at varying (e.g., higher or lower) heights within the interior of access line 2702 in order to customize the resistance of the top and bottom portions of access line 2702 located above and below insulating layer 2710.

Access line 2702 is used to access memory cells of a memory array (e.g., memory array 102 of FIG. 1). These memory cells include memory cells 2740, 2742, 2743, 2744, 2746. For example, memory cell 2740 is located overlying insulating layer 2714. Memory cell 2744 is located underlying insulating layer 2714.

Driver 2750 is electrically connected to via 2754. Driver 2750 generates one or more voltages on access line 2702 when accessing memory cells. Central portion 2713 electrically connects via 2754 to left and right portions 2704, 2706 of access line 2702.

An optional resistive layer 2730 is located between via 2754 and central portion 2713. In one example, resistive layer 2730 is similar to resistive layer 2630 of FIG. 26.

Insulating layer 2712 is located at a height of 2709 above a bottom 2707 of access line 2702. Insulating layer 2712 has a central longitudinal axis 2705. Height 2709 is determined by the distance between bottom 2707 and central longitudinal axis 2705. In one example, height 2709 is 30-70 percent of thickness 2711 of access line 2702.

In one example, access layer 2702 provides access to memory cells located in a deck of the memory array above the access line 2702, and to memory cells in a deck below the access line 2702. The height 2709 of insulating layer 2712 can be adjusted so that insulating layer 2712 is positioned more closely to the deck that needs more resistance screening. In one example, a determination is made (e.g., during manufacture) of those decks in the memory array that have a greater need of resistance screening and/or susceptibility to spike currents. In response to this determination, the insulating layer 2712 is positioned more closely to that particular deck(s) to provide increased protection against spike currents.

Insulating layer 2712 has a lateral length 2703. In one example, the lateral length is 50-300 nanometers.

In one embodiment, access line may include one or more resistive layers 2760, 2762. In one example, resistive layers 2760, 2762 can be formed similarly as described above for resistive films 1420, 1422 of FIG. 14.

In one embodiment, an apparatus includes: an access line (e.g., 2702) having a first portion (e.g., 2704), a second portion (e.g., 2706), and a central portion (e.g., 2713). The first and second portions are on opposite sides of the central portion, and each of the first and second portions is configured to access at least one memory cell (e.g., 2743, 2746) of a memory array. The access line includes a first insulating layer (e.g., 2710) in the first portion and a second insulating layer (e.g., 2712) in the second portion. Each of the first and second insulating layers is located in an interior region of the access line.

The apparatus further includes a via (e.g., 2754) electrically connected, by the central portion of the access line, to the first and second portions of the access line; and a driver (e.g., 2750) electrically connected to the via, wherein the driver is configured to generate a voltage on the first portion to access a first memory cell (e.g., 2743), the first memory cell located in a portion of the memory array underlying or overlying the first insulating layer, and to generate a voltage on the second portion to access a second memory cell, the second memory cell located in a portion of the memory array underlying or overlying the second insulating layer.

In one embodiment, the access line is configured to access at least 1,000 memory cells of the memory array; a first group of 100 to 500 memory cells of the memory array is located underlying the first insulating layer; and a second group of 100 to 500 memory cells (e.g., a group including memory cell 2746) of the memory array is located underlying the second insulating layer.

In one embodiment, the access line has a thickness (e.g., 2711), a central longitudinal axis (e.g., 2705) of the second insulating layer (e.g., 2712) is located at a height (e.g., 2709) above a bottom (e.g., 2707) of the access line, and the height is 30 to 70 percent of the thickness.

In one embodiment, each of the first and second insulating layers has a lateral length (e.g., 2703) of 50 to 300 nanometers. For example, the lateral length can be varied to adjust the resistance of the access line 2702 as needed to accommodate varying conditions of spike current discharge.

In one embodiment, the access line further includes a third insulating layer (e.g., 2714) located in an interior region of the first portion of the access line, the third insulating layer spaced apart from the first insulating layer and towards a distal end (e.g., 2701) of the first portion; and the voltage generated on the first portion is used to access a third memory cell, the third memory cell located in a portion of the memory array underlying or overlying the third insulating layer.

In one embodiment, each of the first and second insulating layers includes at least one of silicon nitride, an atomic layer deposition (ALD) oxide, or a thermal oxide.

In one embodiment, the memory array has a cross-point architecture.

In one embodiment, the first memory cell is: a memory cell including chalcogenide; a memory cell including a select device, and a phase change material as a memory element; a self-selecting memory cell including chalcogenide; or a resistive memory cell.

FIGS. 28-32 show steps in the manufacture of a memory device that implements spike current suppression by forming one or more charge screening structures in an access line, in accordance with some embodiments. In one example, the memory device is memory device 101.

Figure 28:
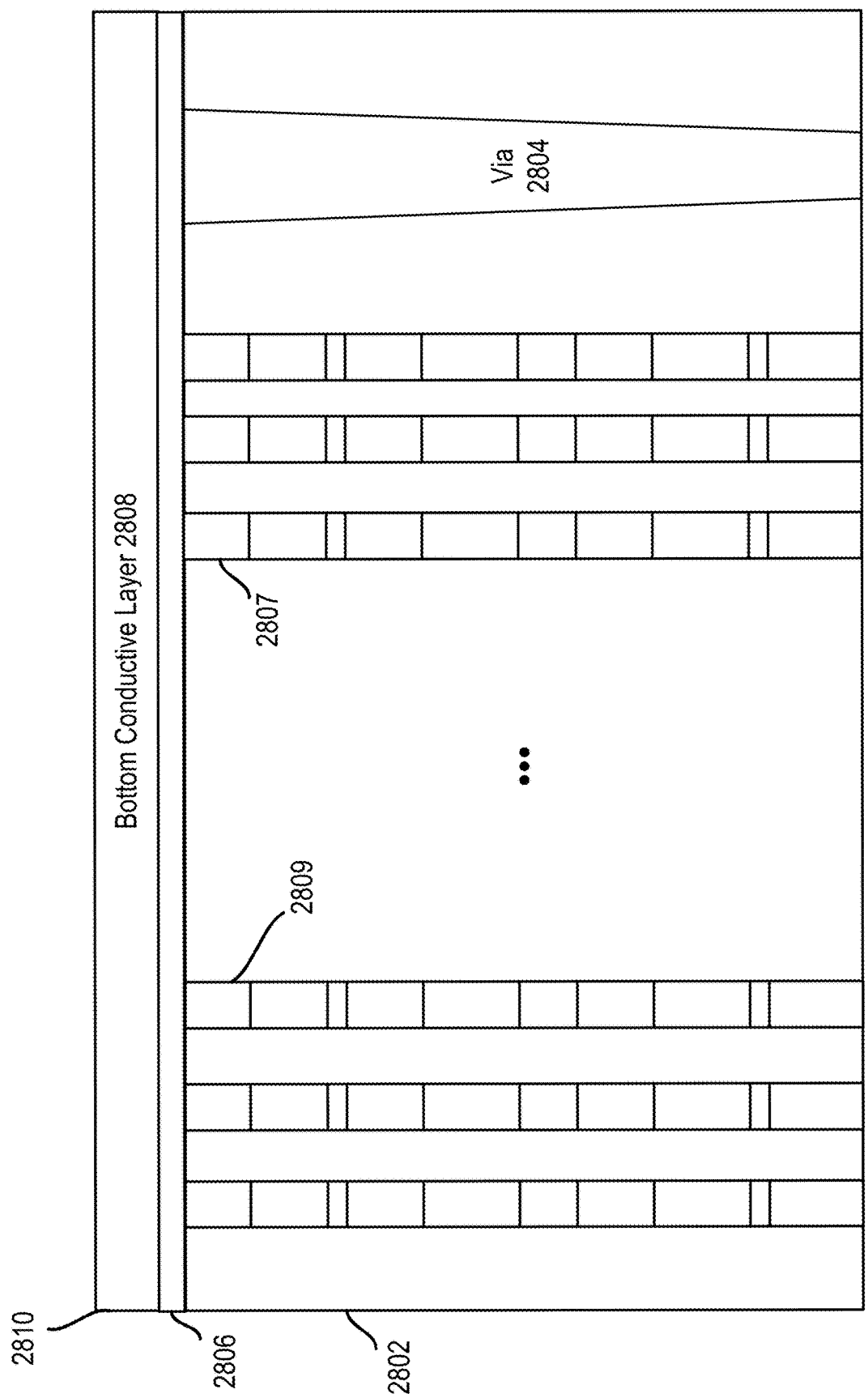
FIGS. 28-32 show steps in the manufacture of a memory device that implements spike current suppression by forming one or more charge screening structures in an access line, in accordance with some embodiments.

FIG. 28 shows a memory array 2802 at an intermediate stage of manufacture. Memory array 2802 includes various memory cells 2807, 2809. Each memory cell 2807, 2809 includes a memory stack containing various layers of materials (e.g., chalcogenide, phase change material, etc.) corresponding to the memory cell technology that has been chosen for use (see, e.g., FIG. 8). Memory cells 2807, 2809 are an example of memory cells 110, 112; memory cells 206, 208; or memory cells 1408, 1410.

Memory array 2802 includes a via 2804. In some cases, via 2804 can be formed on a pad similar to pad 906. Memory array 2802 as shown in FIG. 28 can be formed using conventional manufacturing techniques.

As shown in FIG. 28, a resistive layer 2806 has been formed overlying memory array 2802. In one example, resistive layer 2806 is a tungsten silicon nitride layer. In one example, resistive layer 2806 provides resistive layer 2630 of FIG. 26.

A bottom conductive layer 2808 has been formed overlying resistive layer 2806. Bottom conductive layer 2808 has a distal end 2810. In one example, distal end 2810 corresponds to distal end 2601 of FIG. 26 or 2701 of FIG. 27. In one example, bottom conductive layer 2808 is tungsten. Other conductive materials may be used.

Figure 29:
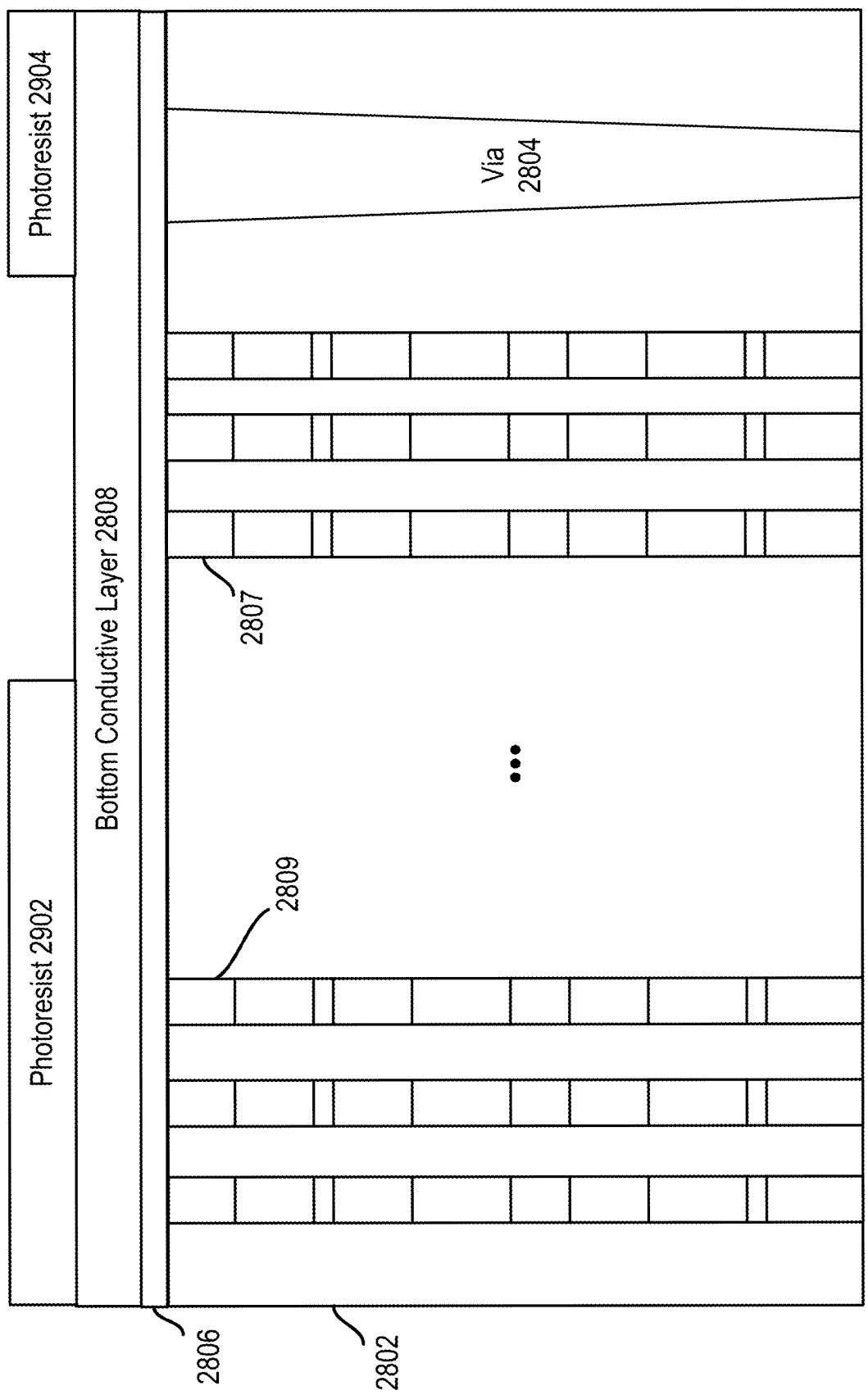

As shown in FIG. 29, a photoresist layer has been formed overlying bottom conductive layer 2808. The photoresist layer is patterned to provide an opening that exposes a portion of bottom conductive layer 2808. After patterning, a portion 2902 of the photoresist layer is overlying a portion of memory cells 2809, and a portion 2904 of the photoresist layer is overlying via 2804. The exposed portion of bottom conductive layer 2808 is located overlying memory cells 2807.

Figure 30:
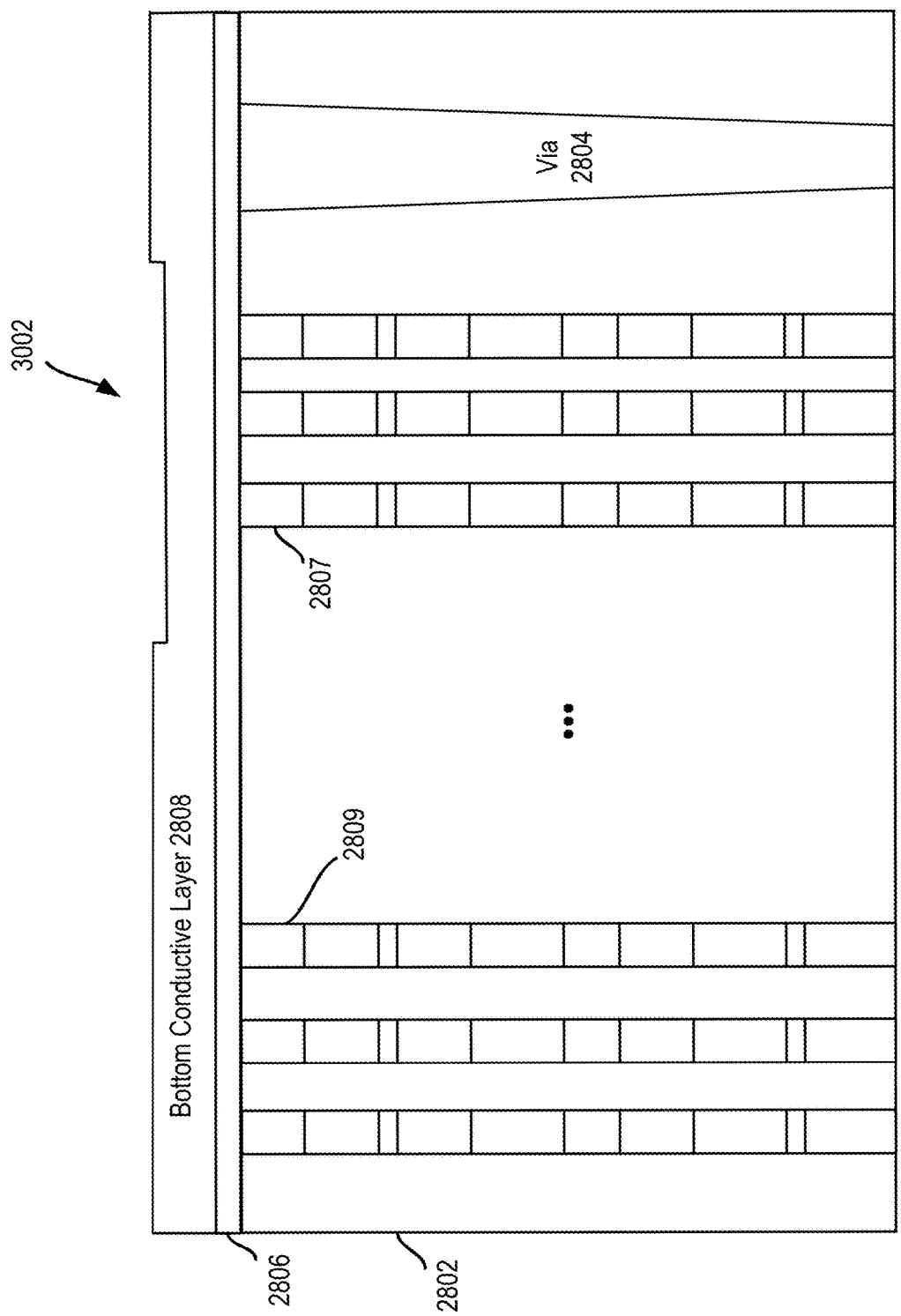

As shown in FIG. 30, the exposed portion of bottom conductive layer 2808 has been etched using the patterned photoresist layer. This etching provides opening 3002 in the top surface of the bottom conductive layer 2808. Opening 3002 has, for example, a depth of 1-15 nanometers. In one example, the etching is a dry etch process used to remove a few nanometers of tungsten. The photoresist is stripped in situ.

Figure 31:
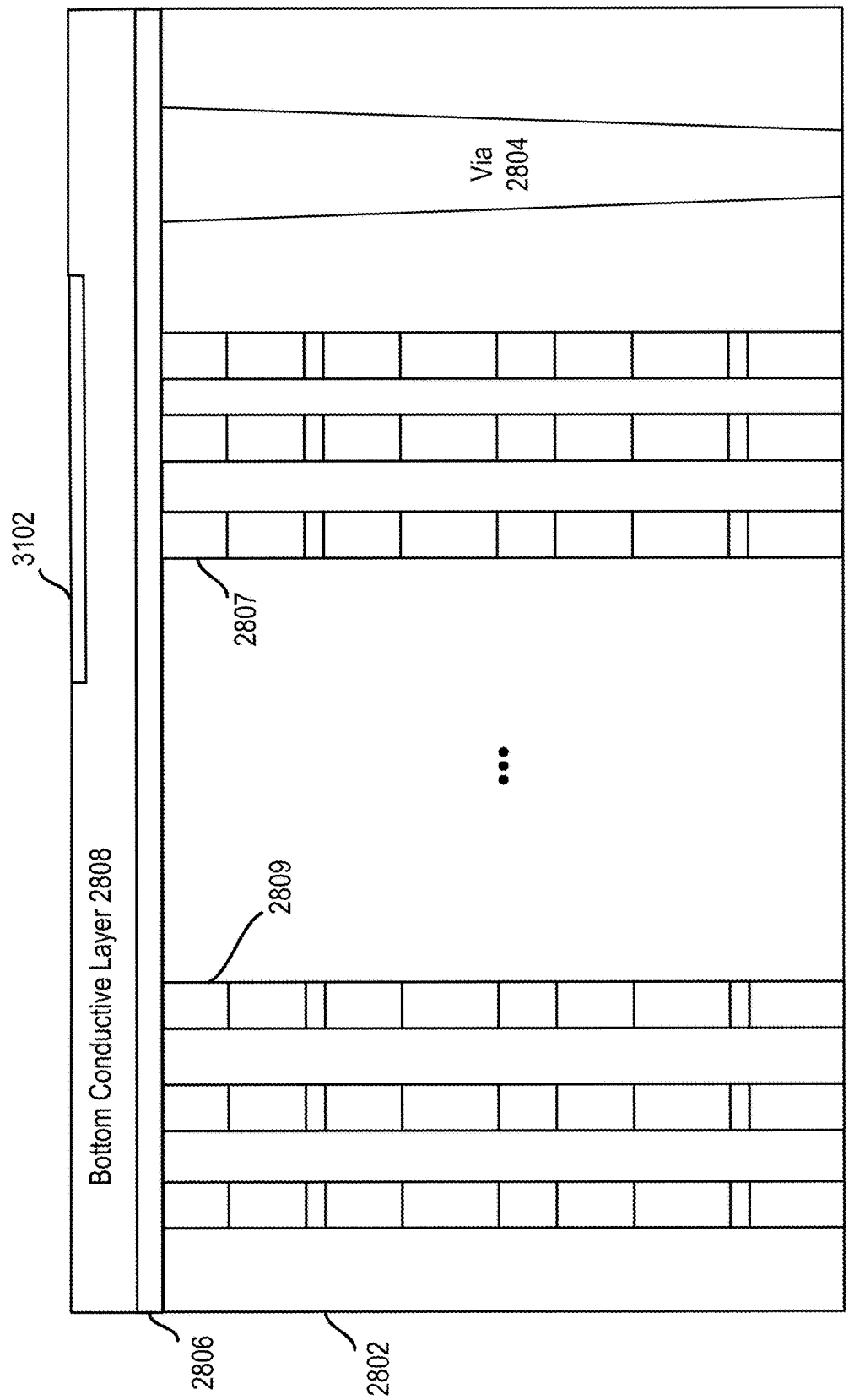

As shown in FIG. 31, an insulating layer 3102 has been formed in opening 3002. In one example, the insulating layer 3102 is silicon nitride, an atomic layer deposition oxide, or a thermal oxide. In one example, insulating layer 3102 has a thickness of less than 15 nanometers. In one example, an oxide is deposited, and chemical mechanical polishing is performed with a stop on the bottom conductive layer 2808 (e.g., tungsten). Other types of insulators can be formed in opening 3002. Memory cells 2807 are located underlying insulating layer 3102.

Figure 32:
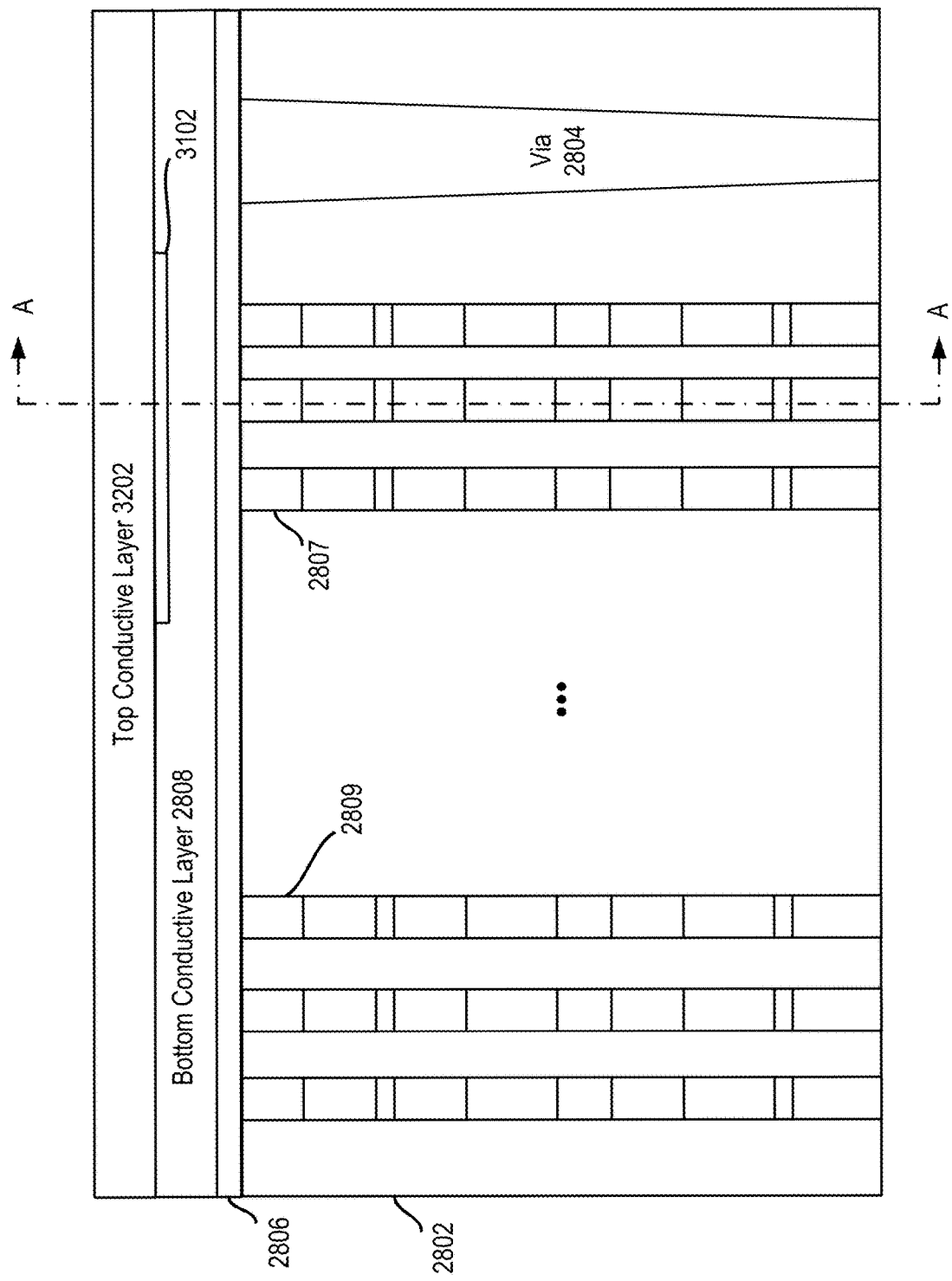

As shown in FIG. 32, a top conductive layer 3202 is formed overlying bottom conductive layer 2808 and insulating layer 3102. In one example, top conductive layer 3202 is tungsten. In other examples, other conductive materials can be used.

In one example, insulating layer 3102 provides insulating layer 2610 of FIG. 26 or insulating layer 2710 of FIG. 27. In one example, top and bottom conductive layers 3202, 2808 provide access line 2602 or 2702.

In one example, top and bottom conductive layers 3202, 2808 provide a bit line for a memory array. In one example, top and bottom conductive layers 3202, 2808 are used to form other bit lines (not shown) of the memory array. In one example, the other bit lines are formed by patterning top and bottom conductive layers 3202, 2808.

Figure 33:
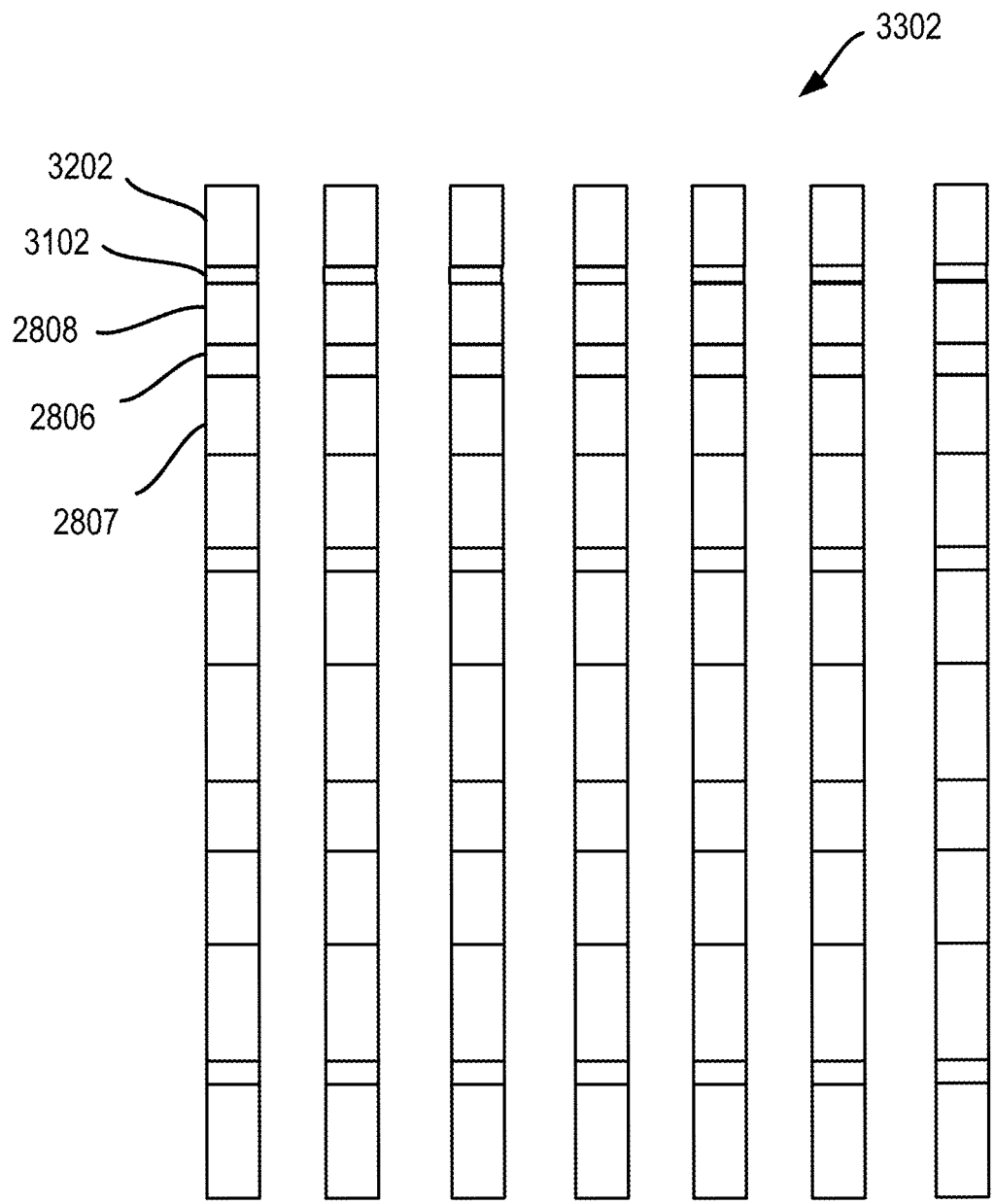
FIG. 33 shows a cross-sectional view of the access line and memory array of FIG. 32.

FIG. 33 shows a cross-sectional view (taken along line AA, as illustrated) of the access line and memory array of FIG. 32. As illustrated, various bit lines 3302 have top and bottom portions separated by insulating layer 3102. Bit lines 3302 are formed by patterning top and bottom conductive layers 3202, 2808.

Figure 34:
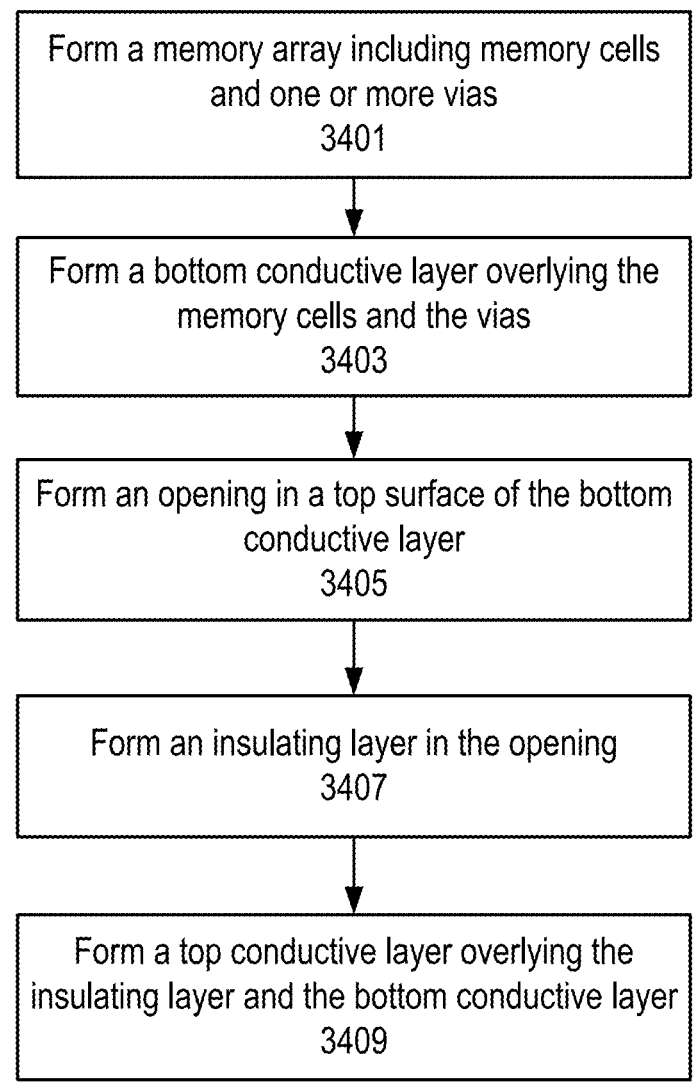
FIG. 34 shows a method for manufacturing a memory device that implements spike current suppression using one or more charge screening structures in an access line, in accordance with some embodiments.

FIG. 34 shows a method for manufacturing a memory device that implements spike current suppression using one or more charge screening structures in an access line, in accordance with some embodiments. For example, the method of FIG. 34 can be used to form the charge screening structures of FIG. 26 or 27. In one example, the manufactured memory device is memory device 101.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 3401, a memory array including memory cells and one or more vias is formed. In one example, the memory cells are memory cells 2640, 2642, 2644, 2646. In one example, the vias include via 2654.

At block 3403, a bottom conductive layer is formed overlying the memory cells in the vias. In one example, the bottom conductive layer is bottom conductive layer 2808.

At block 3405, an opening is formed in a top surface of the bottom conductive layer. In one example, an opening is formed in bottom conductive layer 2808.

At block 3407, an insulating layer is formed in the opening. In one example, the insulating layer is insulating layer 3102.

At block 3409, a top conductive layer is formed overlying the insulating layer and the bottom conductive layer. In one example, the top conductive layer is top conductive layer 3202.

In one embodiment, a method includes: forming a memory array including memory cells and at least one via; forming a first conductive layer (e.g., 2808) overlying the memory cells and the via, wherein the first conductive layer is electrically connected to the memory cells; forming an opening in a top surface of the first conductive layer; forming an insulating layer (e.g., 3102) in the opening, wherein a portion of the memory cells are located underlying the insulating layer; and forming a second conductive layer (e.g., 3202) overlying the insulating layer and the first conductive layer, wherein the first and second conductive layers provide an access line for accessing the memory cells.

In one embodiment, the method further includes forming a driver (e.g., 2750) in a semiconductor substrate. The memory array is formed overlying the semiconductor substrate, and the driver is electrically connected to the via. The driver is configured to generate a voltage on the access line for selecting one or more of the memory cells.

In one embodiment, the method further includes forming a resistive layer (e.g., 2806) between the via and the first conductive layer.

In one embodiment, the method further includes: forming a photoresist layer overlying the first conductive layer; patterning the photoresist layer; and etching the first conductive layer using the patterned photoresist layer to provide the opening in the top surface of the first conductive layer.

In one embodiment, a first portion (e.g., 2904) of the patterned photoresist layer is overlying the via, and a second portion (e.g., 2902) of the patterned photoresist layer is overlying a portion of the memory cells located at a distal end (e.g., 2810) of the first conductive layer.

In one embodiment, the access line is a first one of a plurality of bit lines (e.g., bit lines 3302 of FIG. 33), other ones of the bit lines are used to access other memory cells in the memory array, and the plurality of bit lines is formed from the first conductive layer and the second conductive layer.

In one embodiment, the formed opening has a depth of 1 to 15 nanometers.

Figure 35:
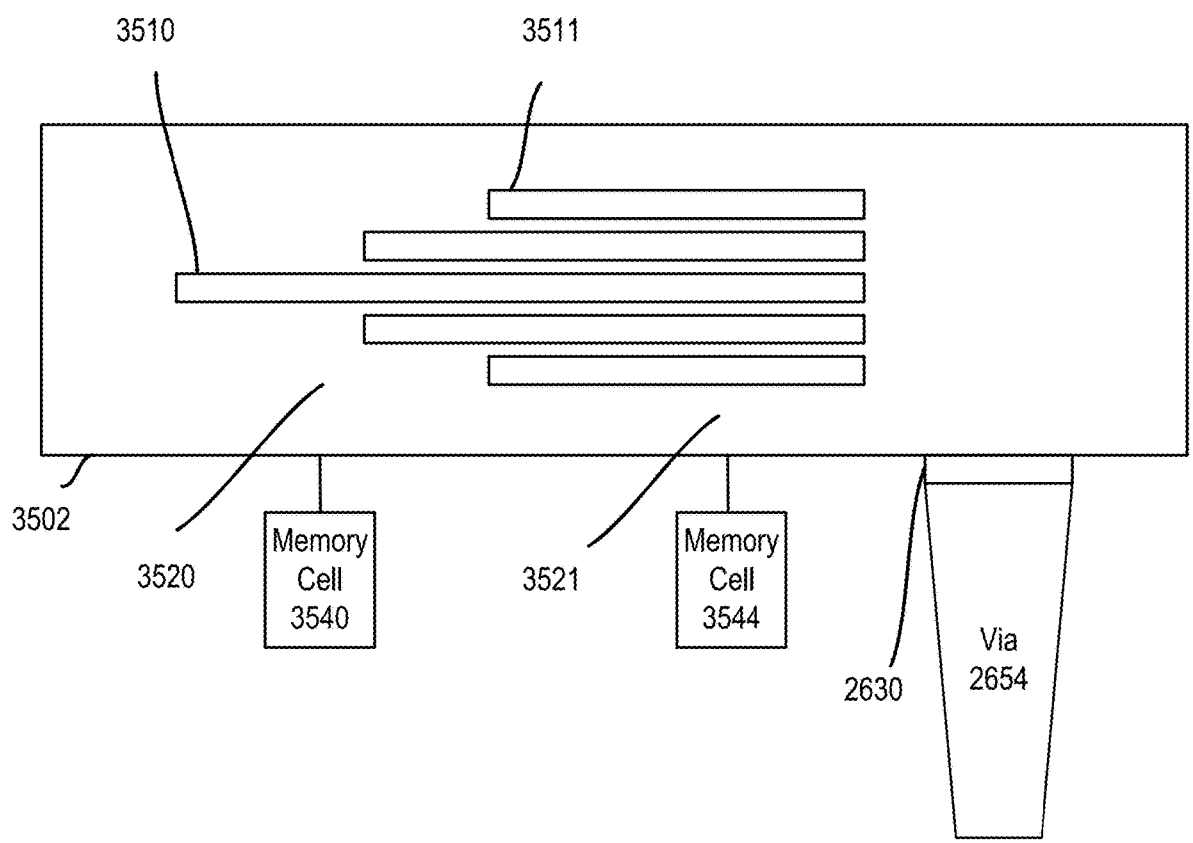
FIG. 35 shows an access line having multiple insulating layers located in an interior region of the access line and used for spike current suppression, in accordance with some embodiments.

FIG. 35 shows an access line 3502 having multiple insulating layers located in an interior region of the access line and used for spike current suppression, in accordance with some embodiments. In one example, access line 3502 is access line 2602 or 2702.

Access line 3502 includes various insulating layers arranged in parallel with respect to a vertical orientation, as illustrated. These insulating layers include insulating layer 3510 and 3511. In one example, each of the insulating layers is similar to insulating layer 2610 or 2710.

The lateral length of each insulating layer can be varied to customize a resistance of access line 3502 at various points along the access line 3502. In one embodiment, varying the lateral length of the insulating layers provides a gradient in the resistance of the top and/or bottom portions of access line 3502 that are above or below the insulating layers. For example, the resistance of bottom portion 3520 of access line 3502 that is overlying memory cell 3540 is less (due to a greater thickness of the conductive material of access line 3502) than the resistance of bottom portion 3521 of access line 3502 that is overlying memory cell 3544 (due to a lesser thickness of the conductive material of access line 3502).

In one example, memory cell 3544, which is nearer to via 2654, is more susceptible to spike current damage than memory cell 3540, which is further away from via 2654. Thus, increased resistance to spike current damage is provided by a greater number of overlying insulating layers. Memory cell 3540 is less susceptible to spike current damage, and thus has a lower number of overlying insulating layers.

In various embodiments, the number of insulating layers provided in parallel can vary between two or more as desired. Although only a left portion of the insulating layers is illustrated as having a gradient, the right portion of the insulating layers may also have a gradient.

In addition, the length of each insulating layer can be varied. It is not required that the insulating layers be formed to have a symmetrical structure. In one example, memory cells overlying access line 3502 have a different susceptibility to spike current damage (e.g., due to a different type of memory cell or structure), such that the structure of the insulating layers closer to the top surface of access line 3502 is different than the structure of the insulating layers closer to the bottom surface of access line 3502.

In one embodiment, the vertical spacing between the insulating layers can also vary from one layer to another. In one example, the vertical spacing between each insulating layer is 5-30 nanometers.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations of a memory device may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Functions can be implemented using hardwired circuitry without software instructions, or in combination with software instructions. Thus, the techniques are not limited to any specific combination of hardware circuitry and software, nor to any particular source for the instructions executed by a computing device.

The memory device as described above can include one or more processing devices (e.g., processing device 116), such as a microprocessor, executing sequences of instructions contained in a memory, such as ROM, volatile RAM, non-volatile memory, cache or a remote storage device.

Routines executed to implement memory operations may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically include one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods for a memory device (e.g., read or write operations). The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement various functions of a memory device. Thus, the techniques are neither limited to any specific combination of hardware circuitry and software nor to any particular source for the instructions executed by a computing device.

Various embodiments set forth herein can be implemented for memory devices that are used in a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system (e.g., memory device 101) so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
    a memory array comprising memory cells;
    an access line configured to access the memory cells, the access line having a first conductive portion and a second conductive portion on opposite sides of the access line;
    a first insulating layer in an interior region of the access line, the first insulating layer underlying or overlying a first memory cell; and
    a second insulating layer in the interior region of the access line and parallel to the first insulating layer, wherein the second insulating layer is vertically above or below the first insulating layer;
    wherein a lateral length of the first insulating layer is different than a lateral length of the second insulating layer;
    wherein memory cells above the access line have a type or structure different from memory cells below the access line;
    the first insulating layer has a structure corresponding to the memory cells below the access line; and
    the second insulating layer has a structure corresponding to the memory cells above the access line.

2. The apparatus of claim 1, wherein multiple insulating layers are located in the interior region, the multiple insulating layers include the first insulating layer, and lateral lengths of the multiple insulating layers are varied to provide a gradient in a resistance of at least a portion of the access line.

3. The apparatus of claim 2, wherein a vertical spacing between the multiple insulating layers varies from one of the insulating layers to another of the insulating layers.

4. The apparatus of claim 1, wherein:
    the access line comprises a top conductive layer formed overlying a bottom conductive layer;
    the top conductive layer is overlying the first insulating layer; and
    the bottom conductive layer is underlying the first insulating layer.

5. The apparatus of claim 1, further comprising a via, wherein:
    the access line includes a central conductive portion overlying the via; and
    the first insulating layer does not extend into the central conductive portion.

6. The apparatus of claim 5, further comprising a resistive layer between the via and the central conductive portion.

7. The apparatus of claim 6, wherein the resistive layer comprises tungsten silicon nitride.

8. An apparatus comprising:
    an access line having a first insulating layer in a first portion and a second insulating layer in a second portion, the second insulating layer parallel to the first insulating layer and is vertically above or below the first insulating, each of the first and second insulating layers located in an interior region of the access line;
    a driver configured to generate a voltage on the access line to access a first memory cell, the first memory cell located in a portion of the memory array underlying or overlying the first insulating layer; and
    a via configured to electrically connect the access line to the driver;
    wherein the access line further includes a second insulating layer located in the interior region of the access line, the second insulating layer laterally spaced apart from the first insulating layer.

9. The apparatus of claim 8, wherein the access line has a thickness, a central longitudinal axis of the first insulating layer is located at a height above a bottom of the access line, and the height is 30 to 70 percent of the thickness.

10. The apparatus of claim 8, wherein the first insulating layer has a lateral length of 50 to 300 nanometers.

11. The apparatus of claim 8, wherein the first insulating layer comprises at least one of silicon nitride, an atomic layer deposition (ALD) oxide, or a thermal oxide.

12. An apparatus comprising:
    a memory array comprising memory cells and at least one via;
    a first conductive layer overlying the memory cells and the via, wherein the first conductive layer is electrically connected to the memory cells;
    an insulating layer overlying a portion of the first conductive layer, wherein a portion of the memory cells are located underlying the insulating layer; and
    a second conductive layer overlying the insulating layer and the first conductive layer, wherein the first and second conductive layers provide an access line for accessing the memory cells, the second conductive layer parallel to the first conductive layer and is vertically above or below the first conductive layer.

13. The apparatus of claim 12, wherein the access line is a first one of a plurality of bit lines, other ones of the bit lines are used to access other memory cells in the memory array, and the plurality of bit lines is formed from the first conductive layer and the second conductive layer.

14. The apparatus of claim 12, further comprising:
    a driver located in a semiconductor substrate, wherein the memory array is overlying the semiconductor substrate, and the driver is electrically connected to the via;
    wherein the driver is configured to generate a voltage on the access line to select one or more of the memory cells.

15. The apparatus of claim 12, wherein the memory array has a cross-point architecture, and each memory cell is:
    a memory cell comprising chalcogenide;
    a memory cell comprising a select device, and a phase change material as a memory element;
    a self-selecting memory cell comprising chalcogenide; or
    a resistive memory cell.

* * * * *